US008421438B2

(12) United States Patent
Pratt et al.

(10) Patent No.: US 8,421,438 B2
(45) Date of Patent: *Apr. 16, 2013

(54) APPARATUS AND METHOD FOR DIFFUSION SENSING

(75) Inventors: Ryan M Pratt, High Point, NC (US); Karl J Couglar, Oak Ridge, NC (US); David K Homol, Kernersville, NC (US)

(73) Assignee: Skyworks Solutions, Inc., Woburn, MA (US)

( * ) Notice: Subject to any disclaimer, the term of this patent is extended or adjusted under 35 U.S.C. 154(b) by 407 days.

This patent is subject to a terminal disclaimer.

(21) Appl. No.: 12/844,301

(22) Filed: Jul. 27, 2010

(65) Prior Publication Data

US 2011/0298444 A1 Dec. 8, 2011

Related U.S. Application Data

(60) Provisional application No. 61/352,330, filed on Jun. 7, 2010.

(51) Int. Cl.
*G01R 19/00* (2006.01)
*G01R 27/08* (2006.01)

(52) U.S. Cl.
USPC ............................ 324/76.11; 324/713; 702/64

(58) Field of Classification Search ............... 324/76.11, 324/713, 522; 702/1, 57, 64, 116, 117, 127
See application file for complete search history.

(56) References Cited

U.S. PATENT DOCUMENTS

| 4,529,897 | A |   | 7/1985  | Suzuki et al.    |         |
|-----------|---|---|---------|------------------|---------|
| 5,117,125 | A | * | 5/1992  | Mayes            | 327/125 |
| 5,646,550 | A |   | 7/1997  | Campbell et al.  |         |
| 6,020,778 | A |   | 2/2000  | Shigehara et al. |         |
| 6,084,386 | A |   | 7/2000  | Takahashi et al. |         |
| 6,198,344 | B1| * | 3/2001  | Sung             | 327/545 |
| 6,356,488 | B1|   | 3/2002  | Kang             |         |
| 6,384,684 | B1|   | 5/2002  | Redman-White     |         |
| 6,462,611 | B2|   | 10/2002 | Shigehara et al. |         |
| 6,784,722 | B2|   | 8/2004  | Tang et al.      |         |
| 6,839,211 | B2|   | 1/2005  | Ajit             |         |

(Continued)

FOREIGN PATENT DOCUMENTS

WO PCT/US2011/039336 6/2011
WO WO 2011/156293 12/2011

OTHER PUBLICATIONS

International Search Report in PCT/US2011/039336 (WO 2011/156293), dated Feb. 27, 2012.
Written Opinion of the International Searching Authority in PCT/US2011/039336 (WO 2011/156293), dated Feb. 27, 2012.

(Continued)

*Primary Examiner* — Hoai-An D Nguyen
(74) *Attorney, Agent, or Firm* — Knobbe Martens Olson & Bear LLP

(57) ABSTRACT

Apparatuses and methods for diffusion sensing are disclosed. In one embodiment, an apparatus includes a complimentary metal oxide semiconductor (CMOS) switch and a switch sense block. The switch includes a gate, a drain, a source, and a well. The source and drain are formed in the well. The gate is formed adjacent the well between the source and drain, and the source is configured to receive a bias voltage from a power amplifier. The switch sense block is configured to measure a signal indicative of the voltage of at least one of the source or drain voltage of the switch and to generate an output signal based on the measurement.

24 Claims, 22 Drawing Sheets

U.S. PATENT DOCUMENTS

| | | | |
|---|---|---|---|
| 6,972,596 B1 * | 12/2005 | Proebsting et al. | 326/83 |
| 7,301,402 B2 | 11/2007 | Norris et al. | |
| 7,315,196 B2 | 1/2008 | Wada | |
| 7,385,439 B2 | 6/2008 | Makino et al. | |
| 7,474,139 B2 | 1/2009 | Tanzawa | |
| 7,508,266 B1 | 3/2009 | Hissen et al. | |
| 7,839,218 B2 | 11/2010 | Shimamoto et al. | |
| 7,936,187 B1 | 5/2011 | Wu et al. | |
| 7,969,203 B1 | 6/2011 | Wu et al. | |
| 8,008,963 B2 | 8/2011 | Sonehara et al. | |
| 8,008,970 B1 | 8/2011 | Homol et al. | |
| 8,310,277 B2 * | 11/2012 | Su et al. | 327/58 |
| 8,330,530 B2 | 12/2012 | Homol et al. | |
| 2002/0125922 A1 | 9/2002 | Kawagoshi et al. | |
| 2003/0201799 A1 | 10/2003 | Takauchi et al. | |
| 2005/0012548 A1 | 1/2005 | Shigaki | |
| 2005/0059362 A1 | 3/2005 | Kalajo et al. | |
| 2007/0285149 A1 | 12/2007 | Nakatani et al. | |
| 2007/0285953 A1 * | 12/2007 | Koo et al. | 363/21.02 |
| 2008/0272755 A1 | 11/2008 | Melanson | |
| 2009/0215413 A1 * | 8/2009 | Ahn et al. | 455/127.1 |
| 2010/0109751 A1 | 5/2010 | Soltanian et al. | |

OTHER PUBLICATIONS

U.S. Appl. No. 12/844,449, filed Jul. 27, 2010, Apparatus and Method for Well Buffering.
U.S. Appl. No. 12/844,491, filed Jul. 27, 2010, Apparatus and Method for Disabling Well Bias.
U.S. Appl. No. 12/844,511, Apparatus and Method for Enable Detection, filed Jul. 27, 2010.
U.S. Appl. No. 12/844,449, Apparatus and Method for Well Buffering, filed Jul. 27, 2010.
PCT/US2011/039336, Apparatus and Methods for Radio Frequency Switching, filed Jun. 6, 2011.
U.S. Appl. No. 12/844,491, Apparatus and Method for Disabling Well Bias, filed Jul. 27, 2010.

* cited by examiner

APPARATUS AND METHOD FOR DIFFUSION SENSING

PRIORITY CLAIM

This application claims the benefit of priority under 35 U.S.C. §119(e) of U.S. Provisional Patent Application No. 61/352,330, entitled "Circuits & Systems," filed Jun. 7, 2010, which is hereby incorporated herein by reference in its entirety to be considered part of this specification.

BACKGROUND

1. Field

Embodiments of the invention relate to electronic systems, and in particular, to radio frequency (RF) electronics.

2. Description of the Related Technology

RF power amplifiers can be used to boost the power of a RF signal having a relatively low power. Thereafter, the boosted RF signal can be used for a variety of purposes, included driving the antenna of a transmitter.

Power amplifiers can be included in mobile phones to amplify a RF signal for transmission. For example, in mobile phones having a time division multiple access (TDMA) architecture, such as those found in Global System for Mobile Communications (GSM), code division multiple access (CDMA), and wideband code division multiple access (W-CDMA) systems, a power amplifier can be used to shift power envelopes up and down within prescribed limits of power versus time. It can be important manage the amplification of a RF signal, as a particular mobile phone can be assigned a transmission time slot for a particular frequency channel. Power amplifiers can be employed to aid in regulating the power level of the RF signal over time, so as to prevent signal interference from transmission during an assigned receive time slot and to reduce power consumption.

There is a need for improved power amplifiers. Furthermore, there is a need for power amplifier systems have reduced power consumption, lower manufacturing cost and enhanced performance.

SUMMARY

In certain embodiments, the present disclosure relates to an apparatus for controlling one or more power amplifiers. The apparatus includes a first complimentary metal oxide semiconductor (CMOS) switch having a gate, a drain, a source, and a well, the source and drain formed in the well, the gate formed adjacent the well between the source and drain, and the source configured to receive a radio frequency signal from a first power amplifier. The apparatus further includes a switch enable detect block configured to compare a signal indicative of the gate voltage of the first switch to a first reference signal and to generate an output comparison signal based at least partly on the result. The apparatus further includes a power amplifier bias control block configured to enable the first power amplifier based at least partly on the output comparison signal from the switch enable detect block.

In various embodiments, the well has a p-type doping and the first switch includes an n-well for electrically isolating the well from a substrate.

In some embodiments, the apparatus further includes a gate bias control block for biasing the gate voltage of the first switch, the gate bias control block configured to bias the gate voltage of the first switch to at least two voltage levels.

In a number of embodiments, the switch enable detect block is configured to compare an enable signal of the gate bias control block to the reference signal.

In accordance with several embodiments, the gate bias control block includes at least one charge pump.

According to some embodiments, the switch enable detect block is configured to compare the gate voltage of the first switch to the reference signal.

In certain embodiments, the reference signal is a voltage of the well of the first CMOS switch.

In various embodiments, the apparatus further includes a second CMOS switch having a gate, a drain, a source, and a well, the source and drain formed in the well, the gate formed adjacent the well between the source and drain, and the source configured to receive a radio frequency signal from a second power amplifier.

In several embodiments, the switch enable detect block is further configured to compare a signal indicative of the gate voltage of the second switch to a second reference signal and to generate the output comparison signal based at least partly on the comparison, and wherein the power amplifier bias control block is configured to enable the second power amplifier based at least partly on the output comparison signal from the switch enable detect block.

In certain embodiments, the apparatus further includes a well bias control block for biasing the well voltage of the first and second switches to a well bias voltage, the well bias control block configured to bias the well bias voltage to at least two voltage levels.

In accordance with a number of embodiments, the first and second reference signals are equal to about the well bias voltage.

In various embodiments, the switch enable detect block is a NOR gate configured to receive the gate voltage of the first switch as a first input and the gate voltage of the second switch as a second input, the negative supply of the NOR gate equal to about the well bias voltage.

In some embodiments, the apparatus further includes a level shifter configured to receive the output comparison signal from the switch enable detect block and provide a level shifted output comparison signal to the power amplifier bias control block.

In a number of embodiments, the first switch and the first power amplifier are disposed on separate dies.

In certain embodiments, the present disclosure relates to a method of controlling one or more power amplifiers. The method includes setting a first power amplifier in a disabled state. The method further includes measuring a signal indicative of a gate voltage of a CMOS switch having a source configured to receive a radio frequency signal from the first power amplifier. The method further includes comparing the measured signal to a reference signal. The method further includes setting the first power amplifier in an enabled state based at least partly on the comparison.

In various embodiments, comparing the measured signal to a reference signal includes determining if the gate voltage of the switch is greater than a well voltage of the switch by at least about a threshold voltage of the first switch.

According to several embodiments, comparing the measured signal to a reference signal includes determining if the gate voltage of the switch is greater than the well voltage of the switch by at least about n times the threshold voltage of the switch, n being an integer greater than or equal to one.

In some embodiments, the method further includes further biasing the gate voltage of the switch.

In accordance with certain embodiments, biasing the gate voltage of the switch includes biasing the gate voltage of the switch using a charge pump.

In a number of embodiments, comparing the measured signal to a reference signal includes comparing an enable signal of the charge pump to the reference signal.

In several embodiments, the method further includes providing a quiescent current of the power amplifier to the source of the switch after enabling the power amplifier.

In various embodiments, the method further includes providing a radio frequency signal from the first power amplifier to an antenna of a wireless device through the switch.

In certain embodiments, the present disclosure relates to a computer-readable storage medium including instructions that when executed by a processor perform a method of controlling a power amplifier configured to provide a radio frequency signal to a CMOS switch. The method includes setting the power amplifier in a disabled state. The method further includes receiving a comparison signal, the comparison signal based at least partly upon a comparison of a reference signal to a signal indicative of a gate voltage of the CMOS switch. The method further includes setting the power amplifier in an enabled state based at least partly on the comparison signal.

In some embodiments, the present disclosure relates to an apparatus for controlling one or more power amplifiers. The apparatus includes means for setting a first power amplifier in a disabled state. The apparatus further includes means for measuring a signal indicative of a gate voltage of a CMOS switch, the CMOS switch configured to receive a radio frequency signal from the power amplifier. The apparatus further includes means for comparing the measured signal to a reference signal and for generating a comparison signal based at least partly on the result. The apparatus further includes means for setting the power amplifier in an enabled state based at least partly on the comparison signal.

In certain embodiments, the present disclosure relates to an apparatus for sensing a bias voltage of a switch. The apparatus includes a complimentary metal oxide semiconductor (CMOS) switch having a gate, a drain, a source, and a well, the source and drain formed in the well, the gate formed adjacent the well between the source and drain, and the source configured to receive a bias voltage from a power amplifier. The apparatus further includes a switch sense block configured to measure a signal indicative of the voltage of at least one of the source or drain voltage of the switch and to generate an output signal based on the measurement.

In a number of embodiments, the well has a p-type doping and the switch includes an n-well for electrically isolating the well from a substrate.

According to various embodiments, the switch sense block is configured to measure a signal indicative of the source voltage of the switch.

In several embodiments, the switch sense block is configured to measure a signal indicative of the drain voltage of the switch.

In accordance with some embodiments, the switch sense block includes a filter for filtering the measured signal to produce a filtered signal and a voltage detector for generating the output signal based at least partly upon the voltage level of the filtered signal.

In certain embodiments, the filter is a low pass filter.

In various embodiments, the filter is a RC filter.

In several embodiments, the voltage detector is an inverter.

In a number of embodiments, the apparatus further includes a well bias control block for biasing the well voltage of the first switch, the well bias control block configured to bias the well voltage to at least two voltage levels.

In certain embodiments, the well bias control block is configured to select the voltage level for biasing the well based at least partly on the output signal of the switch sense block.

In some embodiments, the well bias control block includes at least one charge pump.

According to various embodiments, the apparatus further includes a resistor having a first end electrically connected to the source of the switch and a second end electrically connected to the drain of the switch.

In some embodiments, the first switch and the first power amplifier are disposed on separate dies.

In certain embodiments, the present disclosure relates to a method for sensing a bias voltage of a CMOS switch configured to receive a radio frequency signal from a power amplifier. The method includes measuring a signal indicative of at least one of a source voltage or a drain voltage of the switch. The method further includes generating an output signal based on the measurement.

In accordance with various embodiments, measuring the signal includes measuring the source voltage of the switch.

In a number of embodiments, measuring the signal includes measuring the drain voltage of the switch.

In some embodiments, the method further includes biasing a well of the switch to a voltage level corresponding to a disabled state of the well.

According to certain embodiments, the method further includes biasing the well of the switch to a voltage level corresponding to an enabled state of the well based at least partly on the output signal.

In a number of embodiments, biasing the well to an enabled state includes biasing the well voltage level using a charge pump.

In some embodiments, the method further includes providing the charge pump a first power supply and providing the power amplifier a second power supply, wherein the first power supply and second power supply are different power supplies.

In various embodiments, the method further includes filtering the measured signal to generate a filtered signal.

According to a number of embodiments, generating the output signal includes comparing the filtered signal to a reference signal.

In several embodiments, generating the output signal includes comparing the filtered signal to a trip point of an inverter.

In certain embodiments, the present disclosure relates to a computer-readable storage medium including instructions that when executed by a processor perform a method for sensing a bias voltage of a CMOS switch configured to receive a radio frequency signal from a power amplifier. The method includes receiving a signal indicative of the voltage of at least one of the source or drain voltage of the switch. The method further includes generating an output signal based on the received signal.

In some embodiments, the present disclosure relates to an apparatus for sensing a bias voltage of a CMOS switch configured to receive a radio frequency signal from a power amplifier. The apparatus includes means for measuring a signal indicative of the voltage of at least one of the source or drain voltage of the switch. The apparatus further includes means for generating an output signal based on the measurement.

In certain embodiments, the present disclosure relates to an apparatus for biasing one or more switches. The apparatus includes a first complimentary metal oxide semiconductor (CMOS) switch having a gate, a drain, a source, and a well, the source and drain formed in the well, the gate formed adjacent the well between the source and drain, and the source configured to receive a bias voltage from a power amplifier. The apparatus further includes a gate bias control block for biasing the gate voltage of the first switch, the gate bias control block configured to bias the gate voltage of the first switch to at least two voltage levels. The apparatus further includes a well bias control block for biasing the well voltage of the first switch, the well bias control block configured to bias the well voltage of the first switch to at least two voltage levels. The apparatus further includes a buffer circuit for increasing the impedance between the well bias control block and the well of the first switch.

According to various embodiments, the well has a p-type doping and the first switch includes an n-well for electrically isolating the well from a substrate.

In some embodiments, the buffer circuit includes a resistor having a first end electrically connected to an output of the well bias control block and a second end electrically connected to the well of the first switch.

In a number of embodiments, the resistor has a resistance ranging between about 10 k$\Omega$ and to about 200 k$\Omega$.

In accordance with several embodiments, the buffer circuit includes an operational amplifier having a positive input, a negative input, and an output configured to control the voltage level of the well of the switch, wherein the well bias control block is configured to control the positive input and the negative input of the operational amplifier based at least partly upon the voltage level of the well of the switch.

In some embodiments, the buffer circuit includes a transconductance amplifier having a positive input, a negative input, and an output configured to deliver a current to the well of the switch, wherein the well bias control block is configured to control the positive input and the negative input of the operational amplifier based at least partly upon the voltage level of the well of the switch.

In certain embodiments, the switch includes an ON state and an OFF state, wherein the well bias control block is configured to bias the well of the switch at about a first voltage level in the OFF state, and wherein the gate bias control block is configured to bias the well of the switch at about the first voltage level in the OFF state.

In a number of embodiments, the switch includes an ON state and an OFF state, wherein the well bias control block is configured to bias the well of the switch at about a first voltage level in the OFF state, and wherein the gate bias control block is configured to bias the well of the switch at about the first voltage level in the OFF state.

According to various embodiments, the well bias control block is configured to bias the well of the switch at about a second voltage level in the ON state, wherein the gate bias control block is configured to bias the well of the switch at about a third voltage level in the ON state, the third voltage level greater than the second voltage level.

In some embodiments, the apparatus further includes a second CMOS switch, wherein the gate bias control block is further configured to bias the gate of the second switch to at least two voltage levels, and wherein the well bias control block is further configured to bias the well of the second switch to at least two voltage levels.

In a number of embodiments, the gate bias control block can bias the gate voltage of the first and second switches to different voltage levels, wherein the well bias control block can bias the well voltage of the first and second switches to different voltage levels.

In certain embodiments, the present disclosure relates to a method of biasing one or more CMOS switches. The method includes biasing a gate of a first CMOS switch configured to receive a radio frequency signal from a power amplifier, biasing the gate including increasing the voltage level of the gate from a first gate voltage level to a second gate voltage level. The method further includes biasing a well of the first CMOS switch, biasing the well including increasing the voltage level of the well from a first well voltage level to a second well voltage level. The method further includes buffering the well of the first switch so as to increase the time it takes to increase the voltage level of the well from the first well voltage level to the second well voltage level.

In accordance with some embodiments, buffering the well includes providing a resistor to increase the impedance between the well and a regulator for biasing the well.

In various embodiments, buffering the well includes providing an operational amplifier to increase the impedance between the well and a regulator for biasing the well.

In several embodiments, buffering the well includes providing a transconductance amplifier to increase the impedance between the well and a regulator for biasing the well.

In a number of embodiments, the first gate voltage level and the first well voltage level are about equal.

According to certain embodiments, the second gate voltage level is greater than the second well voltage level.

In a number of embodiments, biasing the well includes using a charge pump.

In various embodiments, biasing the gate includes using a charge pump.

In accordance with several embodiments, biasing and buffering are performed in an electronic circuit disposed on a single CMOS die.

In some embodiments, the present disclosure relates to an apparatus for biasing one or more CMOS switches. The apparatus includes a means for biasing a gate of a first CMOS switch configured to receive a radio frequency signal from a power amplifier, the means for biasing the gate configured to bias the gate of the first switch to at least two voltage levels. The apparatus further includes a means for biasing a well of the first CMOS switch, the means for biasing the well configured to bias the well of the first switch to at least two voltage levels. The apparatus further includes a means for increasing the impedance between the well of the first switch and the means for biasing the well.

In certain embodiments, the present disclosure relates to an apparatus for disabling a bias voltage for biasing one or more switches. The apparatus includes a first complimentary metal oxide semiconductor (CMOS) switch having a gate, a drain, a source, and a well, the source and drain formed in the well, the gate formed adjacent the well between the source and drain, and the source configured to receive a bias voltage from a power amplifier. The apparatus further includes a well bias control block for biasing the well voltage of the first switch, the well bias control block configured to bias the well voltage of the first switch to at least two voltage levels. The apparatus further includes a disable circuit for disabling the well bias control block so as to prevent the well bias control block from biasing the well.

In several embodiments, the well has a p-type doping and the first switch includes an n-well for electrically isolating the well from a substrate In a number of embodiments, the buffer circuit includes a PMOS transistor having a gate, a drain and a source, the drain of the PMOS transistor electrically connected to the well of the first switch, the source of the PMOS transistor electrically connected to an output of the well bias control block, and the gate of the PMOS transistor electrically connected to a disable control signal.

In accordance with various embodiments, the apparatus further includes an NMOS transistor having a gate, a drain and a source, the drain of the NMOS transistor electrically connected to the well of the first switch, the gate of the NMOS transistor electrically connected to the disable control signal, and the source of the NMOS transistor electrically connected to a voltage reference.

In some embodiments, the voltage reference is a ground supply of a wireless device.

In certain embodiments, the apparatus further includes a buffer circuit for increasing the impedance between the well bias control block and the well of the first switch.

According to a number of embodiments, the buffer circuit is electrically connected between the disable circuit and the well of the first switch.

In various embodiments, the buffer circuit includes a resistor having a first end electrically connected to an output of the disable circuit and a second end electrically connected to the well of the first switch.

In several embodiments, the resistor has a resistance ranging between about 10 kΩ to about 200 kΩ.

In certain embodiments, the buffer circuit includes a PMOS transistor having a gate, a drain and a source and an NMOS transistor having a gate, a drain and a source, the source of the PMOS transistor electrically connected to an output of the well bias control block, the drain of the PMOS transistor electrically connected to the first end of the resistor and to the drain of the NMOS transistor, the gates of the NMOS and PMOS transistors electrically connected to a disable control signal, and the source of the NMOS transistor electrically connected to a voltage reference.

In some embodiments, the buffer circuit is electrically connected between the well bias control block and the disable circuit.

According to a number of embodiments, the buffer circuit includes an operational amplifier having a positive input, a negative input, and an output configured to provide a voltage level for biasing the well to the disable circuit, the well bias control block configured to control the positive input and the negative input of the operational amplifier based at least partly upon the voltage level of the well of the switch.

In certain embodiments, the present disclosure relates to a method of disabling a bias voltage for biasing one or more CMOS switches. The method includes disabling a well bias control circuit for biasing a well of a first CMOS switch using a disable circuit. The method further includes enabling a power amplifier for providing a radio frequency signal to a source of the first switch. The method further includes enabling the well bias control circuit using the disable circuit. The method further includes biasing the well of the first switch using the well bias control circuit.

In some embodiments, biasing the well of the first switch includes biasing the well voltage of the switch using a regulator.

In a number of embodiments, biasing the well of the first switch includes biasing the well voltage of the switch using a charge pump.

In accordance with various embodiments, disabling the well bias control circuit includes increasing the impedance between the regulator and the well of the switch using a first transistor.

In some embodiments, disabling the well bias control circuit further includes biasing the well of the first switch to a voltage reference using a second transistor.

In a number of embodiments, the voltage reference is a ground supply of a wireless device.

In various embodiments, the method further includes buffering the well of the first switch so as to increase the impedance between the well of the first switch and the output of the regulator.

According to several embodiments, buffering the well includes using a resistor to increase the impedance between the well and the regulator.

In some embodiments, buffering the well includes using an operational amplifier to increase the impedance between the well and the regulator.

In a number of embodiments, the present disclosure relates to a computer-readable storage medium including instructions that when executed by a processor perform a method of disabling a bias voltage for biasing one or more CMOS switches. The method includes disabling a well bias control circuit for biasing a well of a first CMOS switch. The method further includes enabling a power amplifier for providing a radio frequency signal to a source of the first switch. The method further includes enabling the well bias control circuit.

In some embodiments, the present disclosure relates to an apparatus for disabling a bias voltage for biasing one or more switches. The apparatus includes means for biasing a well of a first switch. The apparatus further includes means for disabling the means for biasing. The apparatus further includes means for enabling a power amplifier configured to provide a radio frequency signal to a source of the first switch. The apparatus further includes means for enabling the means for biasing.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 12/844,511, titled "APPARATUS AND METHOD FOR ENABLED SWITCH DETECTION," U.S. patent application Ser. No. 12/844,449, titled "APPARATUS AND METHOD FOR WELL BUFFERING," and U.S. patent application Ser. No. 12/844,491, titled "APPARATUS AND METHOD FOR DISABLING WELL BIAS," each filed on even date herewith and each hereby incorporated by reference herein in its entirety.

BRIEF DESCRIPTION OF THE DRAWINGS

FIG. 13E includes a bias control system and a switch.

DETAILED DESCRIPTION OF EMBODIMENTS

The headings provided herein, if any, are for convenience only and do not necessarily affect the scope or meaning of the claimed invention.

Figure 1:
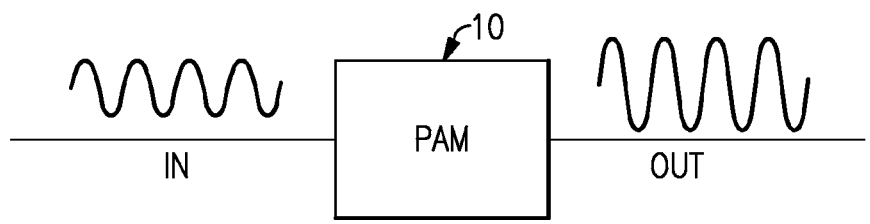
FIG. 1 schematically depicts a power amplifier module for amplifying a radio frequency (RF) signal.

Provided herein are various non-limiting examples of devices and methods for facilitating amplification of a radio frequency (RF) signal. FIG. 1 schematically depicts a power amplifier module (PAM) 10 that can be configured to achieve such an amplification of the RF signal so as to yield an output RF signal. As described herein, the power amplifier module can include one or more power amplifiers (PA).

Figure 2:
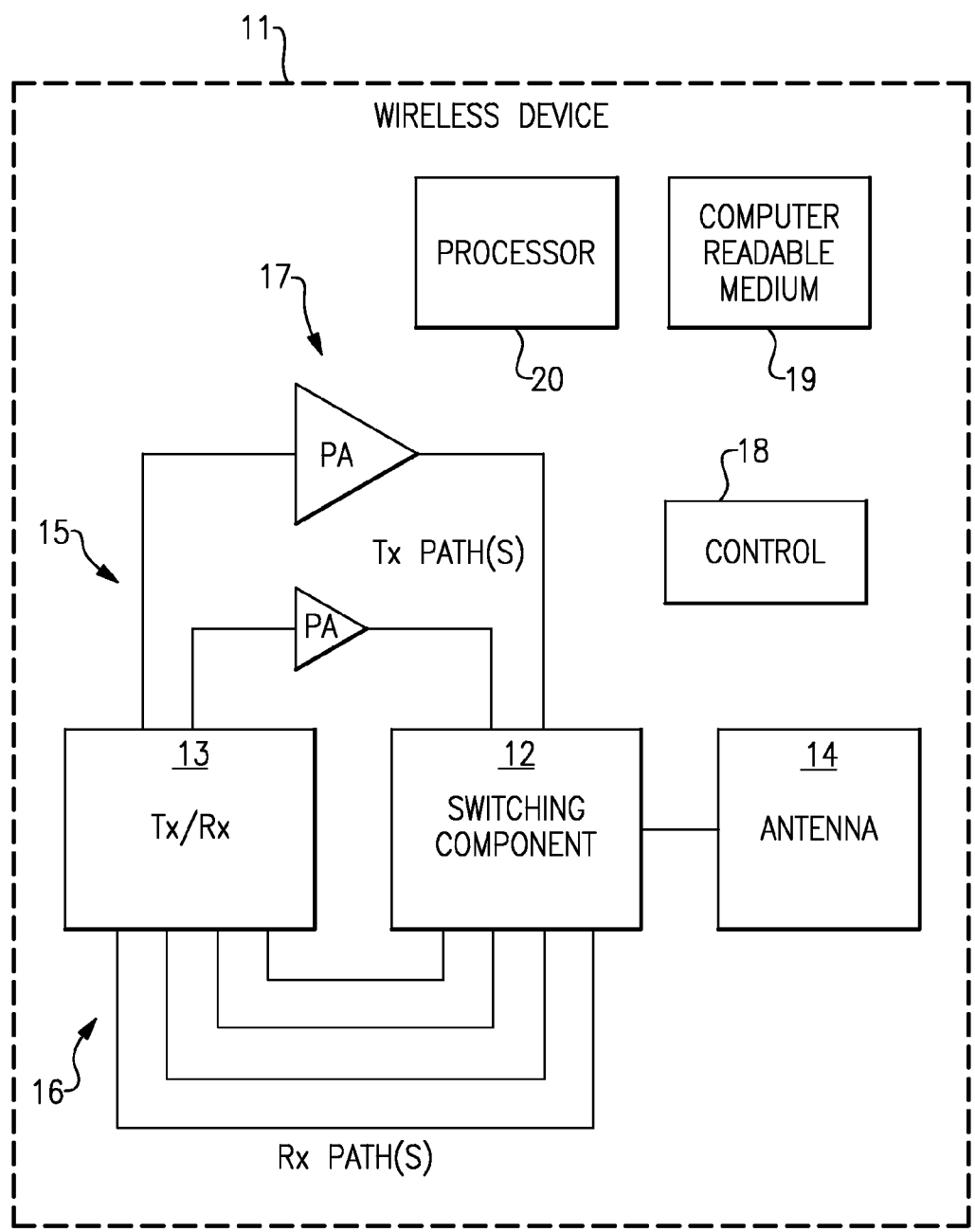
FIG. 2 schematically depicts an example wireless device that can have one or more of the power amplifier modules of FIG. 1 configured to provide one or more functionalities as described herein.

FIG. 2 schematically depicts a device 11, such as a wireless device, for which one or more power amplifiers controlled by one or more features of the present disclosure can be implemented. The example wireless device 11 depicted in FIG. 2 can represent a multi-band and/or multi-mode device such as a multi-band/multi-mode mobile phone.

By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 900 MHz and 1900 MHz bands.

One or more features of the present disclosure can be implemented in the foregoing example modes and/or bands, and in other communication standards. For example, 3 G and 4 G are non-limiting examples of such standards.

In certain embodiments, the wireless device 11 can include a transceiver component 13 configured to generate RF signals for transmission via an antenna 14, and receive incoming RF signals from the antenna 14. It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with one or more antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For example, two example power amplifiers 17 shown can represent amplifications associated with different power output configurations (e.g., low power output and high power output), and/or amplifications associated with different bands.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with.

FIG. 2 shows that in certain embodiments, a switching component 12 can be provided, and such a component can be configured to provide a number of switching functionalities associated with an operation of the wireless device 11. In certain embodiments, the switching component 12 can include a number of switches configured to provide functionalities associated with, for example, switching between different bands, switching between different power modes, switching between transmission and receiving modes, or some combination thereof. Various non-limiting examples of such switches are described herein in greater detail.

FIG. 2 shows that in certain embodiments, a control component 18 can be provided, and such a component can be configured to provide various control functionalities associated with operations of the switching component 12, the power amplifiers 17, and/or other operating component(s). Non-limiting examples of the control component 18 are described herein in greater detail.

FIG. 2 shows that in certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory (19 in FIG. 2) that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

Figure 3A:
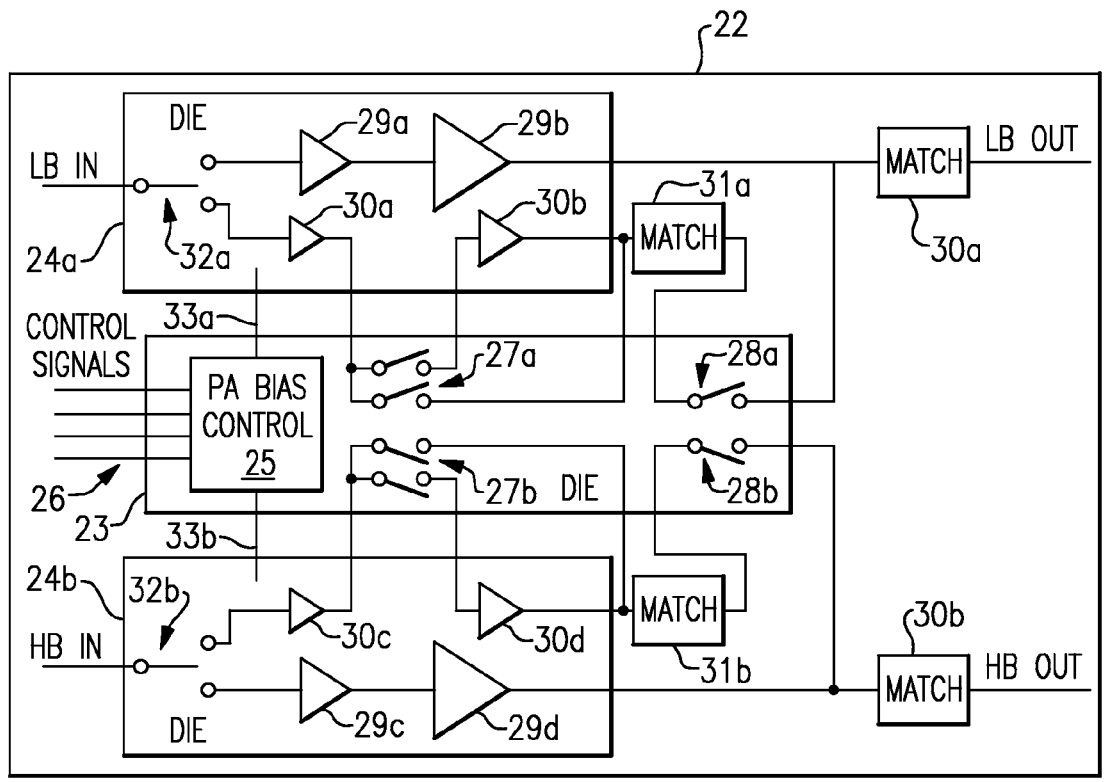
FIGS. 3A and 3B show example system architectures that can be implemented in the wireless device of FIG. 2.
Figure 3B:
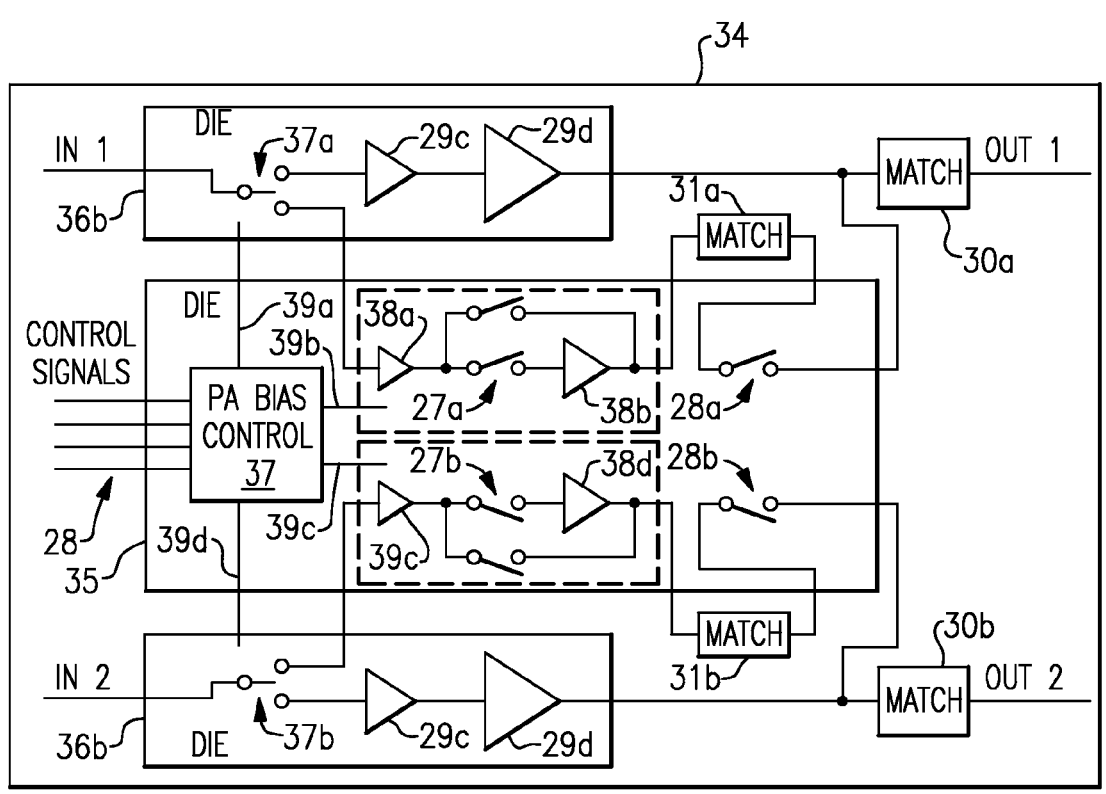

FIGS. 3A and 3B show non-limiting examples of system architectures that can include one or more features of the present disclosure. For the purpose of description, the example architectures are depicted with two RF bands; however, it will be understood that other numbers of RF bands are also possible. For example, system architectures having similar functionalities can be implemented in configurations having more than two bands (e.g., quad-band) or a single-band configuration.

In one example architecture 22, a first RF input indicated as "LB IN" and corresponding to a first band (e.g., a low band) can be amplified by one or more power amplifiers disposed and/or formed on a die 24a. Such amplified output RF signal is indicated as "LB OUT," and can be subjected to impedance matching (e.g., to approximately 50Ω) by a component depicted as 30a. Similarly, a second RF input indicated as "HB IN" and corresponding to a second band (e.g., a high band) can be amplified by one or more power amplifiers disposed and/or formed on a die 24b. Such amplified output RF signal is indicated as "HB OUT," and can be subjected to impedance matching by a component depicted as 30b (e.g., to approximately 50Ω).

In certain embodiments, amplification for a given RF band can include two or more amplification modes. For the example low RF band, the RF input LB IN can be routed to a high power amplification mode or a low/medium power amplification mode via a switch depicted as 32a. If the switch 32a is set for the high power mode, the RF signal can undergo amplification by one or more power amplifiers (e.g., by staged amplifiers 29a and 29b) so as to yield a high power output. If the switch 32a is set for the low/medium power mode, the RF signal can undergo amplification by one or more power amplifiers.

In certain embodiments, the switch 32a need not be employed. For example, the input impedance of the staged amplifiers 29a and 30a can be substantially matched, and the RF input LB IN can be provided to both staged amplifiers 29a and 30a.

In the example shown, a low power mode can be achieved by utilizing a power amplifier 30a; and a medium power mode can be achieved by amplifying the RF signal in stages by the power amplifier 30a and a second power amplifier 30b. Examples of switching and routing of the RF signals to allow selection of the low, medium and high power operating modes are described herein in greater detail. The low/medium amplified output RF signal can be subjected to impedance matching by a component depicted as 31a prior to being output in a manner similar to that of the high power output signal.

Similarly, for the example high RF band, the RF input HB IN can be routed to a high power amplification mode or a low/medium power amplification mode via a switch depicted as 32b. If the switch 32b is set for the high power mode, the RF signal can undergo amplification by one or more power amplifiers (e.g., by staged amplifiers 29c and 29d) so as to yield a high power output.

If the switch 32b is set for the low/medium power mode, the RF signal can undergo amplification by one or more power amplifiers. In the example shown, a low power mode can be achieved by utilizing a power amplifier 30c; and a medium power mode can be achieved by amplifying the RF signal in stages by the power amplifier 30c and a second power amplifier 30d. Examples of switching and routing of the RF signals to allow selection of the low, medium and high power operating modes are described herein in greater detail. The low/medium amplified output RF signal can be subjected to impedance matching by a component depicted as 31b prior to being output in a manner similar to that of the high power output signal.

In the example architecture 22 depicted in FIG. 3A, operation of the low and medium power modes can be facilitated by switch assemblies 27a, 28a (for the low band) and 27b, 28b (for the high band). To operate in a low or medium power mode, for the low band, the switch 28a can be closed, and the switch 32a can be in a state that routes the LB IN signal to the power amplifier 30a. To operate in a medium power mode, a connecting switch (depicted as the upper one in the switch assembly 27a) can be closed and a bypass switch (depicted as the lower one) can be opened, such that the power amplifiers 30a and 30b amplify the LB IN signal in stages to yield the medium power output. To operate in a low output mode, the connecting switch of the switch assembly 27a can be opened and the bypass switch of the switch assembly 27a can be closed, such that the LB IN signal is amplified by the power amplifier 30a by bypasses the power amplifier 30b so as to yield the low power output. Operation of low or medium power mode for the high band can be achieved in a similar manner utilizing the switch assemblies 27b and 28b.

In the example configuration 22 shown in FIG. 3A, various switches (e.g., 27a, 27b, 28a, 28b) are depicted as being part of a die 23. In certain embodiments, the die 23 can also include a power amplifier bias control component 25. The PA bias control component 25 is depicted as controlling the example PAs (29a, 29b, 30a, 30b of the low band portion, and 29c, 29d, 30c, 30d of the high band portion) via bias control lines depicted as 33a and 33b. In certain embodiments, the PA bias control component 25 can be provided with one or more input control signals 26 so as to facilitate one or more functionalities associated with various PAs as described herein.

In certain embodiments, various switches and power amplifiers associated with the dies depicted as 24a, 24b can be fabricated on substrates such as gallium arsenide (GaAs) utilizing devices such as pseudomorphic high electron mobility transistors (pHEMT) or bipolar field effect transistors (BiFET). In certain embodiments, the dies depicted as 24a, 24b in FIG. 3A can be formed on the same GaAs substrate, or on separate GaAs substrates. Further, functionalities associated with the dies depicted as 24a, 24b can be formed on a single die, or on separate dies.

In certain embodiments, various switches (e.g., 27a, 27b, 28a, 28b) associated with operation of various PAs (e.g., 29a, 29b, 30a, 30b of the low band portion, and 29c, 29d, 30c, 30d of the high band portion) can be fabricated as complementary metal-oxide-semiconductor (CMOS) devices. In certain embodiments, at least some of the PA bias control component 25 can be implemented on a CMOS die. In the example shown in FIG. 3A, the switches (e.g., 27a, 27b, 28a, 28b) and the PA bias control component 25 are depicted as being parts of the same CMOS die 26. In certain embodiments, such switches and PA bias control component can be parts of different CMOS dies.

In certain embodiments, at least one power amplifier and one or more switches associated with its operation can be implemented on a CMOS die. FIG. 3B shows an example architecture 34 that can generally provide dual-band signal amplification functionalities similar to that described in reference to FIG. 3A. In FIG. 3B, "IN 1" and "OUT 1" can represent the low band input and output LB IN and LB out; and "IN 2" and "OUT 2" can represent the high band input and output HB IN and HB OUT. Further, switching functionality associated with switches 32a and 32b can be provided by switches 37a and 37b. For high power mode of operation, PAs 29a, 29b, 29c, 29d that are parts of dies 36a, 36b can be similar to the dies 24a, 24b described in reference to FIG. 3A.

In FIG. 3B, power amplifiers 38a, 38b, 38c, 38d corresponding to the medium/low power modes are depicted as being formed on the same die 35 (e.g., CMOS die) on which the switches (e.g., 27a, 27b, 28a, 28b) are formed. Other than these components being on the same CMOS die, operation of the example medium/low power modes can be achieved in a manner similar to those described in reference to FIG. 3A.

Similar to FIG. 3A, the example configuration 34 of FIG. 3B includes a PA bias control component 37 that is part of the example CMOS die 35. The PA bias control component 37 is depicted as receiving one or more input control signals 28 and controlling one or more functionalities associated with the various PAs. The PAs (e.g., 29a, 29b for the first band, and 29c, 29d for the second band) associated with the high power mode are depicted as being controlled via bias control lines 39a and 39b. The PAs (e.g., 38a, 38b for the first band, and 38c, 38d for the second band) associated with the medium/low mode are depicted as being controlled via bias control lines 39c and 39d.

It will be understood that the configurations 22 and 34 of FIGS. 3A and 3B are specific examples of design architectures that can be implemented. There are a number of other configurations that can be implemented utilizing one or more features of the present disclosure.

Figure 4A:
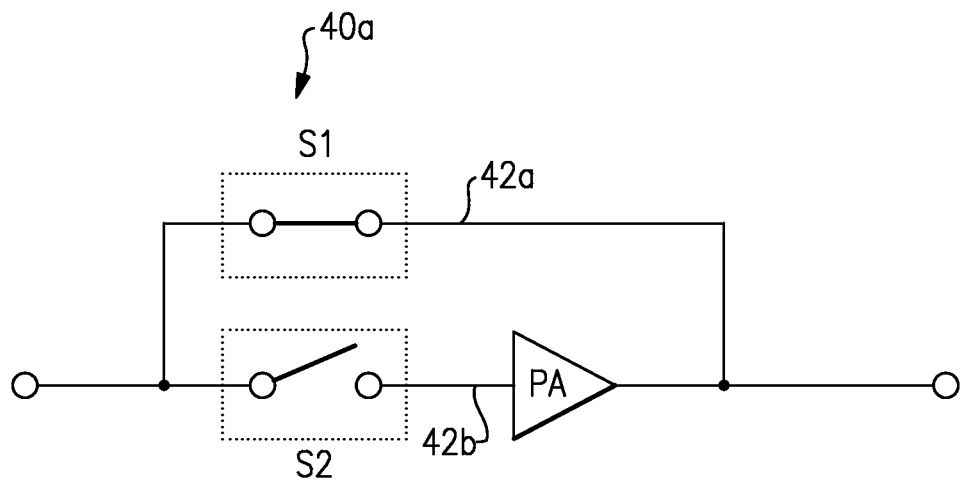
FIGS. 4A and 4B schematically depict an example of how an RF signal to a power amplifier can be switched ON or OFF.
Figure 4B:
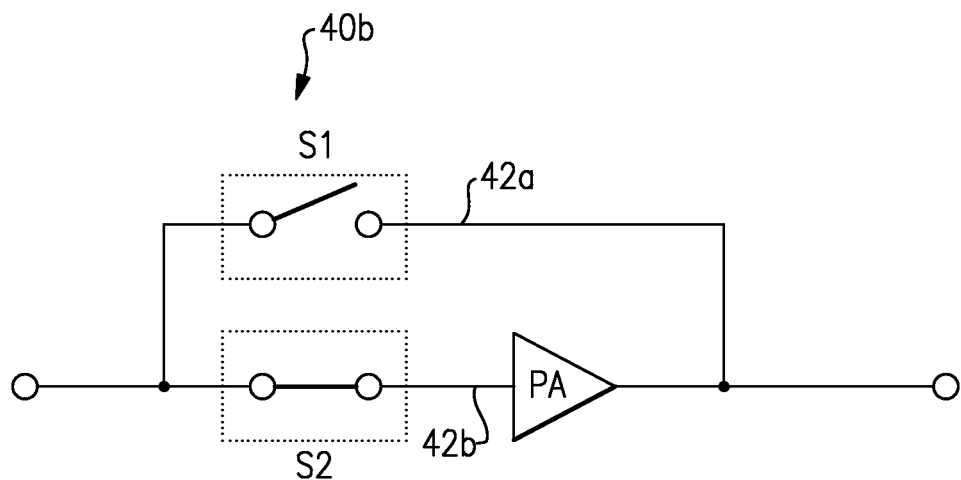

In the context of switches for RF power amplifiers, FIGS. 4A and 4B shows a switching configuration 40 that can form a basis for more complex architectures. In a signal path configuration 40a of FIG. 4A, an RF signal can be routed through a first path 42a by providing a switch S1 that is closed. In the configuration 40a, second path 42b is depicted as having a switch S2 that is open and a power amplifier. Thus, for the purpose of operating the power amplifier in the example path 42b, the configuration 40a can represent an OFF state.

In a signal path configuration 40b of FIG. 4B that can represent an ON state for the power amplifier, the switch S2 on the second path 42b is closed and the switch S1 on the first path 42a is open. For the purpose of description of FIGS. 4A and 4B, the first example path 42a is depicted without any component other than the switch S1. It will be understood that there may be one or more components (e.g., one or more power amplifiers) along the first path 42a.

In the context of power amplifiers that can be included in portable and/or wireless devices (e.g., mobile phones), a power amplifier system can be subjected to varying processes and operating conditions such as voltage and temperature variations. For example, a power amplifier system can be powered using a variable supply voltage, such as a battery of a mobile phone.

In certain situations, it can be important for a power amplifier system to switch between power modes so that the power amplifier switch can control power consumption. For example, in a mobile device embodiment, having a plurality of power modes allows the power amplifier to extend battery life. Control signals, such as mode input signals received on a pin or pad, can be used to indicate a desired mode of operation. The power amplifier system can include a plurality of RF signal pathways, which can pass through power amplification stages of varying gain. Switches can be inserted in and/or about these pathways, and switch control logic can be used to enable the switches and power amplifiers associated with the selected power amplifier RF signal pathway.

Placing a switch in a signal path of a power amplifier (e.g., in the example signal path 42b of FIGS. 4A and 4B) can produce a number of effects. For example, insertion of a switch into a RF signal pathway can result in a loss of signal power due to radiation and resistive losses. Additionally, even a switch in an OFF state placed along an active RF signal pathway can attenuate a RF signal. Thus, it can be important that the switch introduce low insertion loss in both ON and OFF states. Furthermore, it can be important that the switch be highly or acceptably linear, so as to reduce distortion of a RF signal which passes through the switch. Distortion can reduce the fidelity of an RF signal; and reduction of such distortion can be important in a mobile system embodiment.

In certain embodiments, switches can be integrated on a mixed-transistor integrated circuit (IC) having power amplification circuitry, such as a BiFET, BiCMOS die employing silicon or GaAs technologies. Additionally, switches can be provided on a discrete die, such as a pHEMT RF switch die, and can be configured to interface with a mixed-transistor power amplifier die to implement a configurable power amplifier system. However, these approaches can be relatively expensive and consume significant amounts of area as compared to a silicon CMOS technology. Power consumption and the area of a power amplifier system can be important considerations, such as in mobile system applications. Thus, there is a need for employing a CMOS switch in a RF signal power amplifier system.

In certain embodiments, CMOS RF switches can be relatively large, so that the switch resistance in an ON-state can be relatively small so as to minimize RF insertion loss. However, large CMOS RF switches can have undesirable parasitic components, which can cause significant leakages and cause damage to RF signal fidelity. Additionally, the wells and active areas of the CMOS RF switches can have associated parasitic diode and bipolar structures. Without proper control of the wells of a CMOS RF switch, parasitic structures may become active and increase the power consumption of the power amplifier system and potentially render the system dysfunctional. Furthermore, CMOS devices are susceptible to breakdown, such as gate oxide breakdown, and other reliability concerns, so it can be important to properly bias a CMOS RF switch during operation.

In certain embodiments, one or more switches described herein can be selectively activated depending on a variety of factors, including, for example, a power mode of the power amplifier system. For example, in a high power mode a CMOS RF switch may be positioned in an OFF state and configured to be in a shunt configuration with the active RF signal path. The isolated P-well voltage of such a switch can be controlled to both prevent overvoltage or other stress conditions which may endanger the reliability, while optimizing or improving the linearity of the switch. The linearity of the RF signal pathway having a shunt CMOS switch in an OFF-state can be improved by keeping the isolated P-well voltage at a selected voltage (e.g., relatively low voltage) so as to avoid forward biasing of parasitic diode structures formed between the P-well and the N-type diffusion regions of the source and drain. By preventing the forward-biasing of parasitic diode structures, the injection of unintended current into the active RF signal pathway can be avoided, thereby increasing linearity of the power amplifier system.

Figure 5:
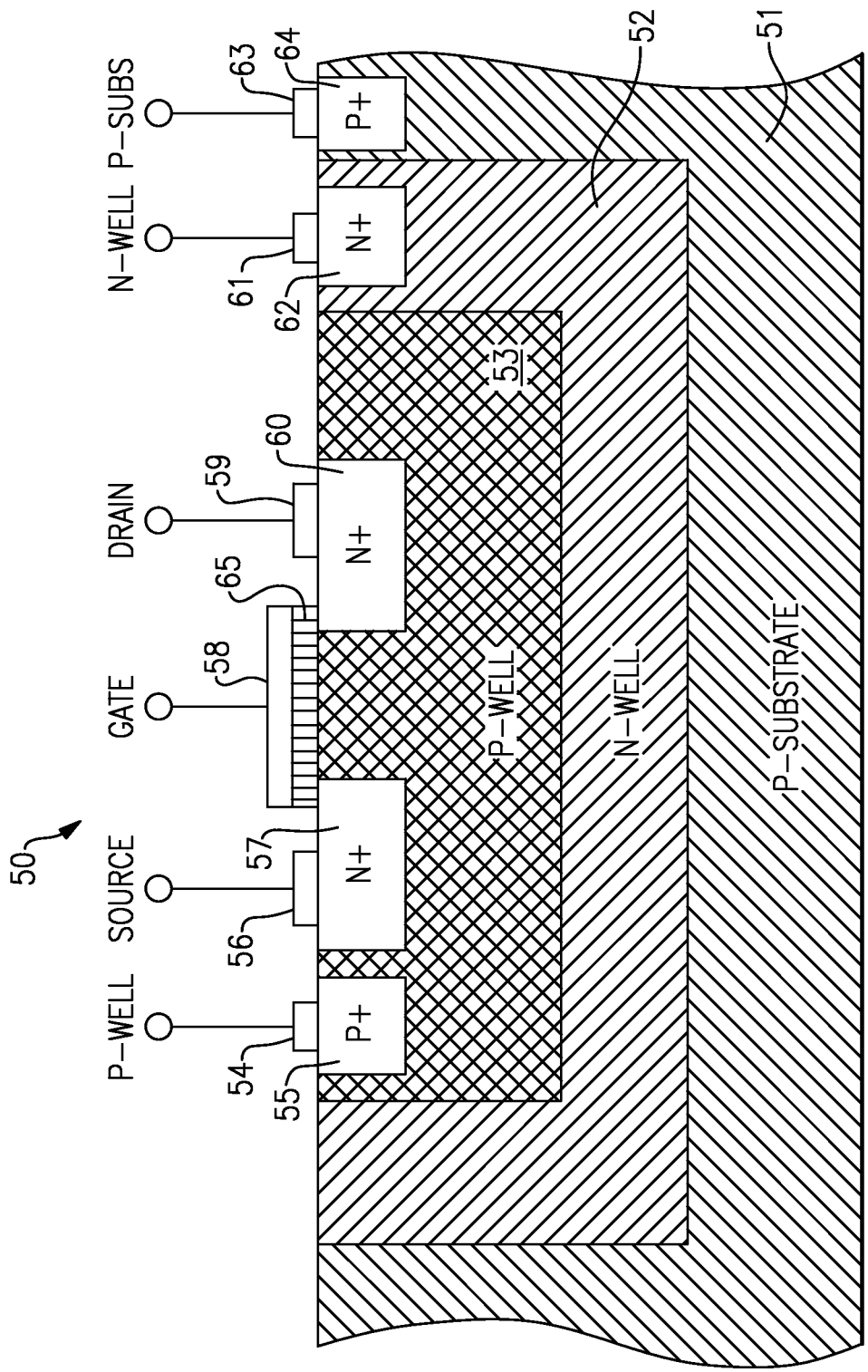
FIG. 5 shows that in certain embodiments, the switch depicted in FIGS. 4A and 4B can be formed as a triple-well CMOS device.

In certain embodiments, some or all of the foregoing example properties can be addressed by one or more features associated with a CMOS RF switch, such as a switch 50 depicted in FIG. 5. The example switch 50 can include a triple-well structure having an N-well 52 and a P-well 53 formed on a P-type substrate 51. As shown in FIG. 5, the N-well 52 can surround the P-well 53 so as to electrically isolate the P-well 53 from the substrate 51. The N-well 52 can be formed by using, for example, a deep N-well or any other suitable N-type buried layer.

The switch 50 further includes a source terminal 56 and a drain terminal 59. An oxide layer 65 is disposed on the P-well 53, and a gate 58 is disposed on top of the oxide layer 65. An N-type source diffusion region and an N-type drain diffusion region corresponding to the source and drain terminals (56, 59) are depicted as regions 57 and 60, respectively. In certain embodiments, formation of the triple-well structure and the source, drain and gate terminals thereon can be achieved in a number of known ways.

In certain operating situations, an input signal can be provided to the source terminal 56. Whether the switch 50 allows the input signal to pass to the drain terminal 59 (so as to yield an output signal) can be controlled by application of bias voltages to the gate 58. For example, application of a first gate voltage can result in the switch 50 being in an "ON" state to allow passage of the input signal from the source terminal 56 to the drain terminal 59; while application of a second gate voltage can turn the switch 50 "OFF" to substantially prevent passage of the input signal.

In certain embodiments, the switch 50 can include a P-well terminal 54 connected to the P-well 53 by a P-type diffusion region 55. In certain embodiments, the P-type diffusion region 55 and the N-type diffusion regions 57 and 60 can be all formed substantially in the P-well 53. In certain embodiments, the P-well terminal 54 can be provided with one or more voltages, or held at one or more electrical potentials, to facilitate controlling of an isolated voltage of the P-well. Examples of such P-well voltages are described herein in greater detail.

In certain embodiments, the switch 50 can include an N-well terminal 61 connected to the N-well 52 by an N-type diffusion region 62. In certain embodiments, the N-type diffusion region 62 can be formed substantially in the N-well 52. In certain embodiments, the N-well terminal 61 can be provided with one or more voltages, or held at one or more electrical potentials, to provide the switch 50 with one or more desired operating performance features. One or more examples of such N-well voltages are described herein in greater detail.

In certain embodiments, the switch 50 can include a P-type substrate terminal 63 connected to the P-type substrate 51 and having a P-type diffusion region 64. In certain embodiments, the P-type diffusion region 64 can be formed substantially in the P-type substrate 51. In certain embodiments, the P-type substrate terminal 63 can be provided with one or more voltages, or held at one or more electrical potentials, to provide the switch 50 with one or more desired operating performance features. One or more examples of such N-well voltages are described herein in greater detail.

Figure 6:
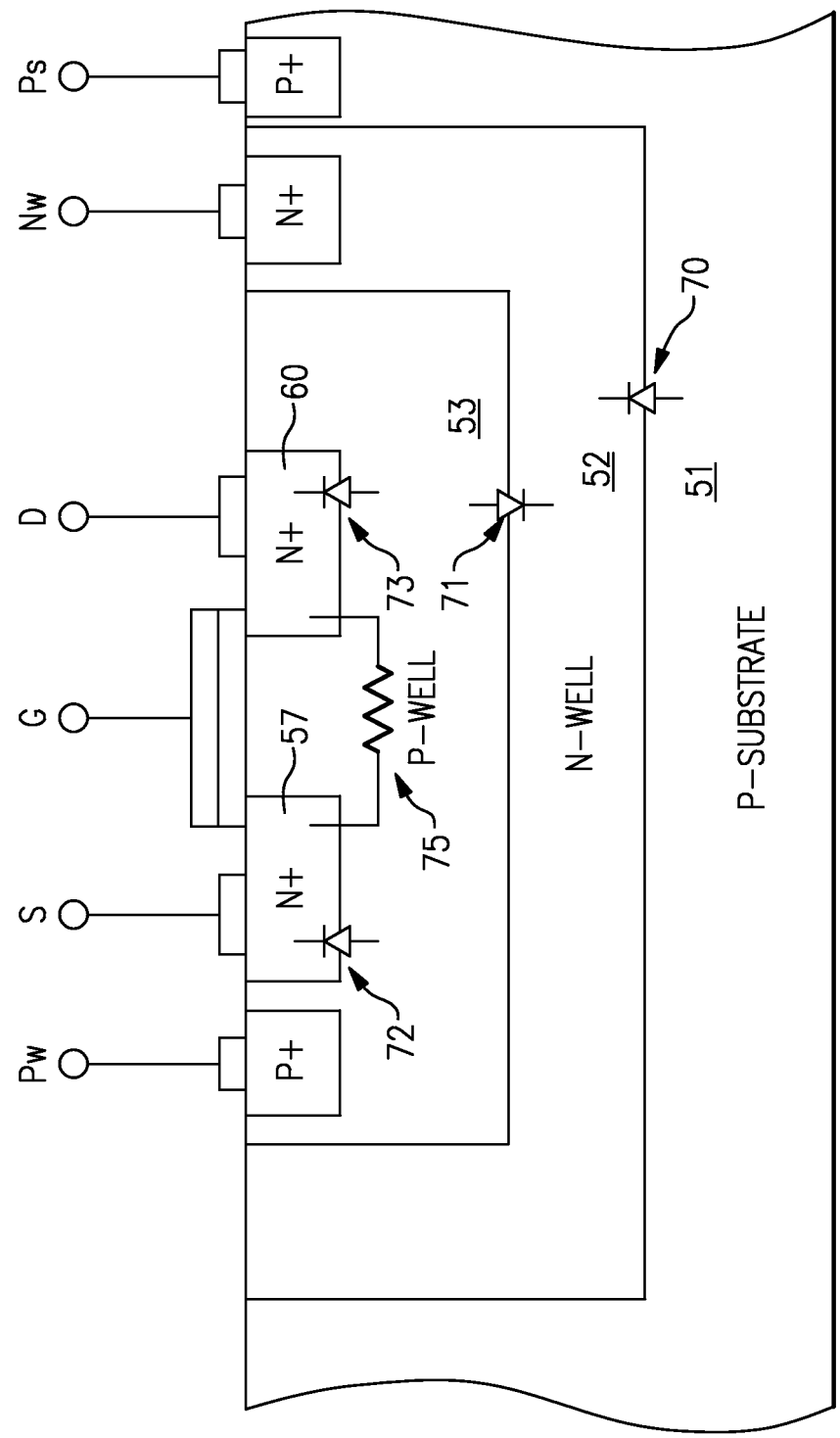
FIG. 6 shows an example configuration for operating the triple-well CMOS switch of FIG. 5.

In the example CMOS device shown in FIG. 5, the switching functionality of the switch 50 is generally provided by an NMOS transistor defined by the N-type diffusion regions (57, 60) in the P-well 53. FIG. 6 shows that for such a configuration, diodes can form at p-n junctions of the triple well structure. For example, a diode 72 can have an anode formed from the P-well 53, and a cathode formed from the N-type diffusion region 57. Similarly, a diode 73 can have an anode formed from the P-well 53 and a cathode formed from the N-type diffusion region 60. Depending on the voltage of the P-well 53 relative to the voltages of the N-type diffusion regions 57 and 60, the diodes 72 and 73 can be biased in, for example, a reverse bias or forward bias region of operation. For the purpose of description herein, bias voltages applied to the N-type diffusion regions 57 and 60 (corresponding to the source and drain terminals, respectively) may or may not be the same. Further, for the purpose of description herein, a reverse bias can include a configuration where a voltage associated with an N-type region is equal to or greater than a voltage associated with a P-type region that forms a p-n junction with the N-type region.

In certain embodiments, the N-type diffusion regions 57 and 60 can be held at substantially the same DC voltage. In certain embodiment, such a configuration can be achieved by providing a relatively large value shunt resistor (e.g., polysilicon resistor) 75 across the source and the drain.

In the context of triple-well CMOS devices, the N-well 52 can substantially isolate the P-well 53 from the P-type substrate 51. In certain embodiments, the presence of the N-well 52 between the P-well 53 and the P-type substrate 51 can result in two additional diodes. As shown in FIG. 6, the illustrated triple well structure can include a diode 71 having an anode formed from the P-well 53 and a cathode formed from the N-well 52. Similarly, the triple well structure can include a diode 70 having an anode formed from the P-type substrate 51 and a cathode formed from the N-well 52.

In certain embodiments, the switch 50 can be operated so as to reverse-bias one or more of the diodes shown in FIG. 6. To maintain such reverse-biases, the source terminal, drain terminal, gate terminal, P-well terminal, N-well terminal, P-substrate terminal, or any combination thereof, can be provided with one or more voltages, or held at one or more electrical potentials. In certain embodiments, such voltages or electrical potentials can also provide one or more additional functionalities that can improve the performance of the switch 50. Non-limiting examples of such performance enhancing features are described herein in greater detail.

Although FIGS. 5 and 6 have described an NMOS transistor as providing the functionality of a switch, a PMOS transistor can also be employed.

Overview of Enabled Gate Detection Systems

Figure 7:
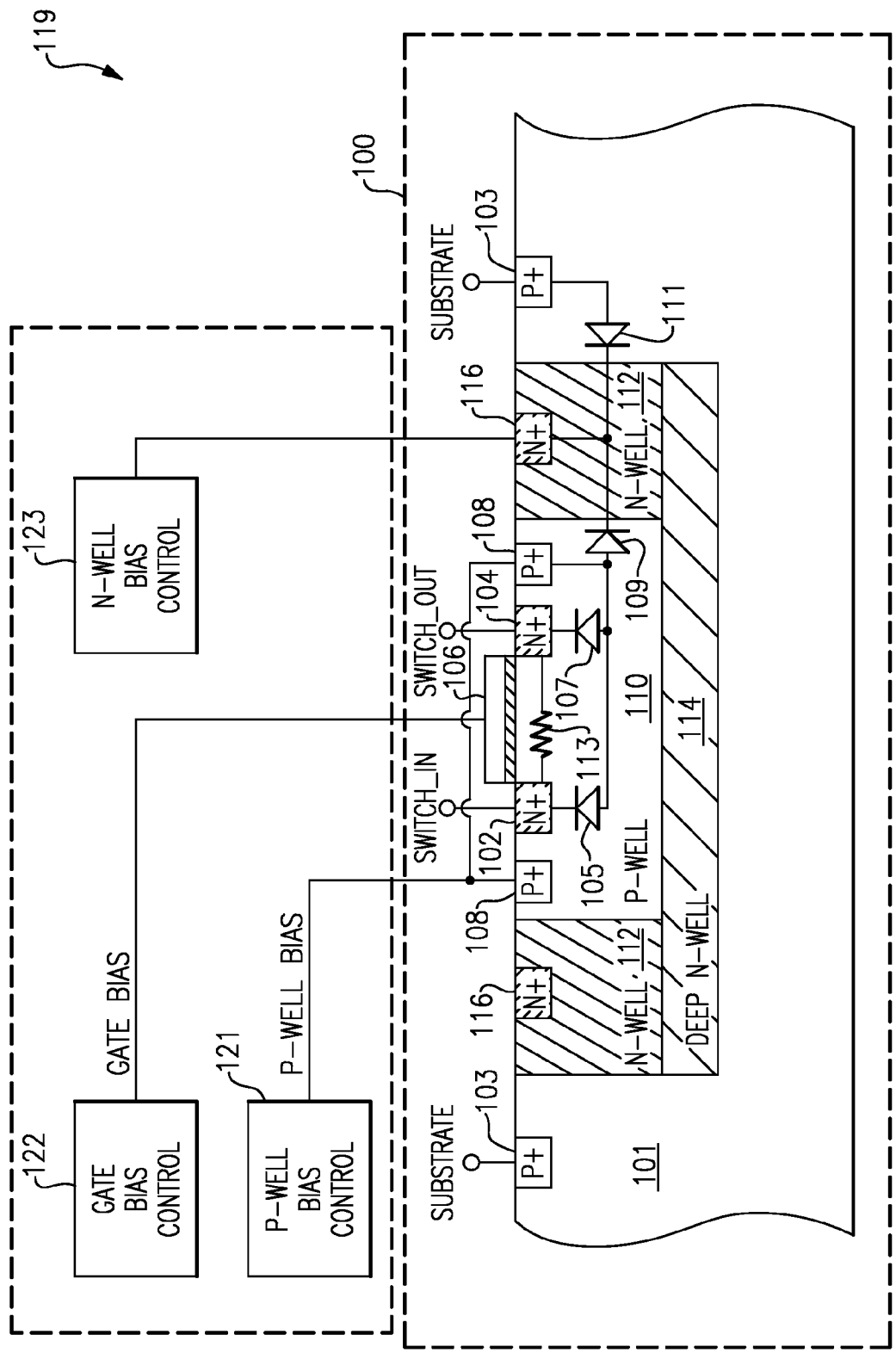
FIG. 7 is a schematic diagram of part of a power amplifier system in accordance with one embodiment.

FIG. 7 is a schematic diagram of part of a power amplifier system 119 in accordance with one embodiment. The power amplifier system 119 includes a switch 100 and a bias control system 120. The bias control system 120 includes a p-well bias control block 121, a gate bias control block 122, and an n-well bias control block 123. The switch 100 includes a substrate 101, substrate contacts 103, a p-well 110, p-well contacts 108, n-wells 112, deep n-well 114, n-well contacts 116, a source 102, a drain 104, a gate 106, and a resistor 113. As shown in FIG. 7, the p-well bias control block 121 can provide a p-well bias voltage to the p-well 110 of the switch 100. Furthermore, the gate bias control block 122 can provide a gate bias voltage to the gate 106 of the switch 100, and the n-well bias control block 123 can provide an n-well bias voltage to the n-well 112 of the switch 100. Although the bias control system 120 is illustrated as biasing only a single switch 100 in FIG. 7, the bias control system 120 can be configured to bias one or more additional switches using either the same or different bias control blocks 121-123.

The switch 100 has been annotated to show certain parasitic diode devices formed from the illustrated switch layout structure, including diodes 105, 107, 109, and 111. As will be described in further detail below, the p-well bias control block 121, the gate bias control block 122, and the n-well bias control block 123 can be configured to bias the p-well 110, the gate 106, and the n-wells 112, respectively, to improve operation of the switch 100 and to prevent unintended biasing of the diodes 105, 107, 109, 111.

The diode 105 includes an anode formed from the p-well 110, and a cathode formed from the source 102. The diode 107 includes an anode formed from the p-well 110 and a cathode formed from the drain 104. The switch 100 has been annotated to show the diode 109, which includes an anode formed from the p-well 110 and a cathode formed from the n-well 112. The diode 111 includes an anode formed from the substrate 101 and a cathode formed from the n-well 112.

As shown in FIG. 7, the switch 100 can include a resistor 113 having a first end electrically connected to the source 102, and a second end electrically connected to the drain 104. In one embodiment, the resistor 113 is formed using polysilicon, and has a resistance selected to be in the range of about 10 kΩ to about 200 kΩ. However, the resistor 113 can be implemented in any suitable manner, including, for example, using an n-diffusion layer resistor having a length and width selected to achieve a desired resistance. Inclusion of the resistor 113 can aid in controlling signal attenuation along an active RF signal when the switch is an OFF state.

The switch 100 can be selectively controlled over a variety of power modes and/or other operational parameters of the power amplifier system 119. For example, in a high power mode the switch 100 can be positioned in an OFF state, while in a low power mode the switch 100 may be position in an ON state. Depending on the configuration, the switch 100 can be in an ON state and part of an active RF signal pathway, or can be in an OFF state in which the switch 100 is in a shunt configuration with the active RF signal pathway. The voltages of the p-well 110, the gate 106, and the n-wells 112 can be controlled over a variety of power modes and/or other operational parameters to prevent overvoltage or other stress conditions which may endanger the reliability, and to optimize the linearity of the switch 100.

During an ON state, the switch 100 can be biased so as to avoid overvoltage conditions, such as gate oxide breakdown, and to provide low RF switch insertion loss. Insertion loss can be influenced by a variety of factors, including body effect caused by the bias of the p-well 110 relative to the gate 106. To prevent gate oxide breakdown and reduce insertion loss, the biasing of the switch 100 can be controlled in the ON state. For example, the voltage of the p-well 110 can selected to be substantially equal the DC voltage of the source and drain 102, 104, while the voltage of the gate 106 can be boosted relative to the DC voltage of the source and drain 102, 104 so as to produce an inversion layer in the p-well 110 adjacent the gate 106, thereby reducing the resistance between the source 102 and drain 104 when the switch 100 is in the ON state.

The biasing of the switch 100 can also be controlled in an OFF state to improve switch performance. For example, the linearity of an RF signal pathway having a shunt switch 100 in an OFF-state can be improved by keeping the voltage of the p-well 110 at a relatively low voltage so as to avoid forward biasing the diodes 105, 107 formed between the p-well 110 and the source 102 and drain 104, respectively. By preventing the forward-bias of the diodes 105, 107, the injection of unintended current into the active RF signal pathway can be avoided, thereby reducing power consumed by the switch 100 and increasing linearity of the power amplifier system 119 in a mode in which the switch 100 is in a shunt configuration with the active RF signal pathway.

To keep the diodes 105, 107 under reverse bias, it can be desirable to keep the voltage potential of the p-well 110 relatively low. However, if a difference in voltage between the gate 106 and the p-well 110 becomes too high, numerous problems can result, including, for example, gate oxide punch-through. Thus, in certain embodiments, both the gate 106 and the p-well 110 voltage can be selectively decreased to simultaneously improve linearity of the RF switch when in the shunt OFF state condition, and to extend the lifetime of the RF switch by avoiding high-voltage gate-body and gate-diffusion stress conditions.

Additionally, in an ON state, it can be desirable to reduce switch insertion loss while keeping the diodes 105, 107 from becoming forward biased. In one embodiment, the voltage of the p-well 110 can be selected to be equal to about the voltage of the source 102 and drain 104, and the voltage level of the gate 106 can be selectively increased to reduce resistance between the source 102 and the drain 104 of the switch 100. The p-well bias control block 121 and the gate bias control block 122 can be used to regulate the voltage of the p-well 110 and the gate 106, respectively, as will be described in further detail below.

The diodes 109 and 113 can be kept under reverse bias using the n-well bias control block 123. The n-well bias control block 123 can be configured to bias the n-well 112 to prevent the diodes 109, 113 from becoming forward biased, while also biasing the n-well 112 to reduce current leakage and to prevent junction breakdown. One embodiment of the n-well bias control block 123 can be as described below with reference to FIG. 8C.

Figure 8A:
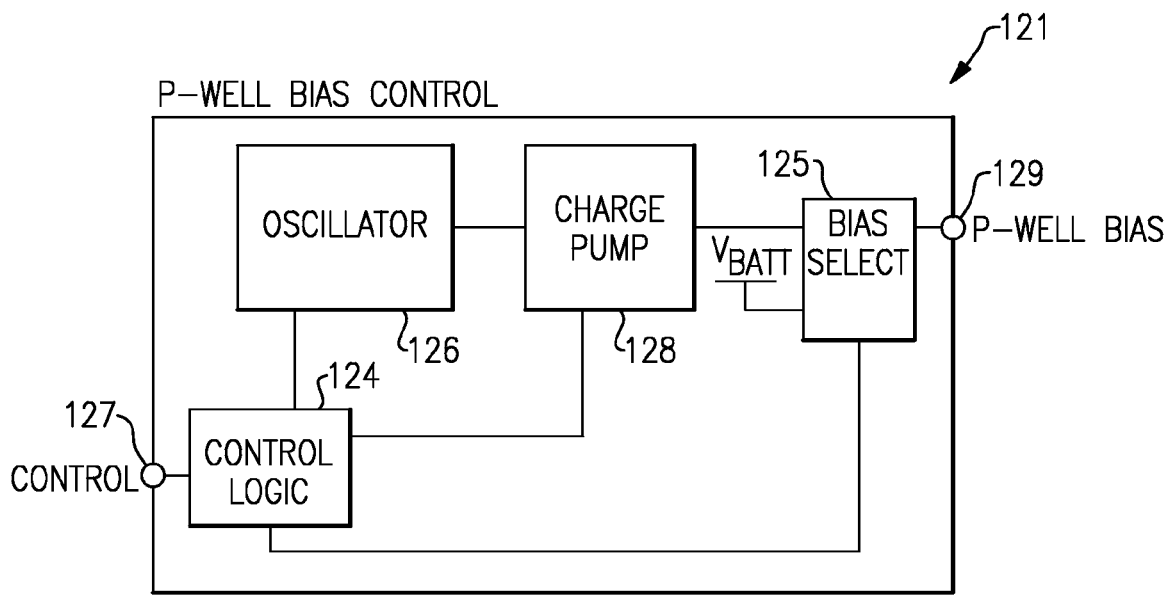
FIG. 8A is a schematic block diagram of a p-well bias control block in accordance with one embodiment.

FIG. 8A is a schematic block diagram of a p-well bias control block 121 in accordance with one embodiment. The p-well bias control block 121 includes control logic 124, an oscillator 126, a charge pump 128, and a mode select block 125. As shown in FIG. 8A, the control logic 124, the oscillator 126, the charge pump 128, and the bias select block 125 can be electrically interconnected using one or more signals. Additionally, the p-well bias control block 121 can receive and/or provide one or more signals from or to external circuitry. For example, the control logic 124 can receive control signals 127 and the bias select block 125 can provide a p-well bias voltage 129.

The control logic 124 can be configured to set one or more settings of p-well bias control block 121. For example, the control logic 124 can enable or disable the p-well bias control block 121 based on the value of an enable control signal. Additionally, the control logic 124 can regulate the frequency of the clock and/or skip one or more phases of the clock so as to control the pumping of the charge pump 128, as will be described below. Furthermore, the control logic 124 can configure the bias select block 125 to control the voltage level of p-well bias over a variety of modes and/or power settings. For example, the control logic 124 can configure the bias select block 125 so as to provide a voltage level equal to about a battery voltage $V_{BATT}$ for a switch in an ON state, and can deliver a voltage level equal to about the output voltage of the charge pump 128 for a switch in an OFF state.

The charge pump 128 can be used to regulate the voltage of the p-well bias 129, and can have a variety of charge pump architectures. For example, the charge pump 128 can be a Dickson charge pump, a four-phase charge pump, or a charge pump employing a charge-transfer-switch (CTS) topology. Additionally, the charge pump 128 can include a clock booster, a non-overlapping clock generator, a filtering capacitor, or a wide variety of other circuits to aid in improving charge pump performance. To aid in regulating the charge pump 128, a voltage or current of the charge pump 128 can be measured by the control logic 124 using, for example, a resistor or capacitive divider. The control logic 124 can compare the measured value to a reference value and control the oscillator 126 based on this comparison. By controlling the oscillator 126, the pump output voltage and current can be regulated to control the charge pump output voltage to either negative or positive voltage levels.

Although FIG. 8A illustrates only one charge pump 128, additional charge pumps can be employed. For example, two charge pumps can operate in parallel to increase current deliver capability, or two charge pumps having unaligned charge transfer phases can operate in a push-pull configuration so that the time that the p-well bias is regulated can be increased relative to a design in which a single charge pump is employed. Additionally multiple charge pumps can be used to provide a plurality of voltage levels which can be used by the bias select block 125 to set the p-well bias 129 to a particular voltage level.

Although FIG. 8A illustrates the p-well bias control block 121 in a configuration in which the p-well bias level can be set to either a charge pump or battery voltage level, the p-well bias control block 121 can be implemented in other ways. For example, the p-well bias control block 121 can be configured to provide a p-well bias voltage using any suitable voltage regulator, including, for example, a linear regulator. Additionally, the bias select block 125 can be configured to deliver p-well bias voltages to a plurality of p-wells. For example, the p-well bias block 121 can deliver p-well bias voltage levels to two or more switches, each of which can have the same or different p-well bias voltage levels. Thus, the bias select block 125 can include a plurality of p-well bias outputs for biasing a plurality of switches.

Figure 8B:
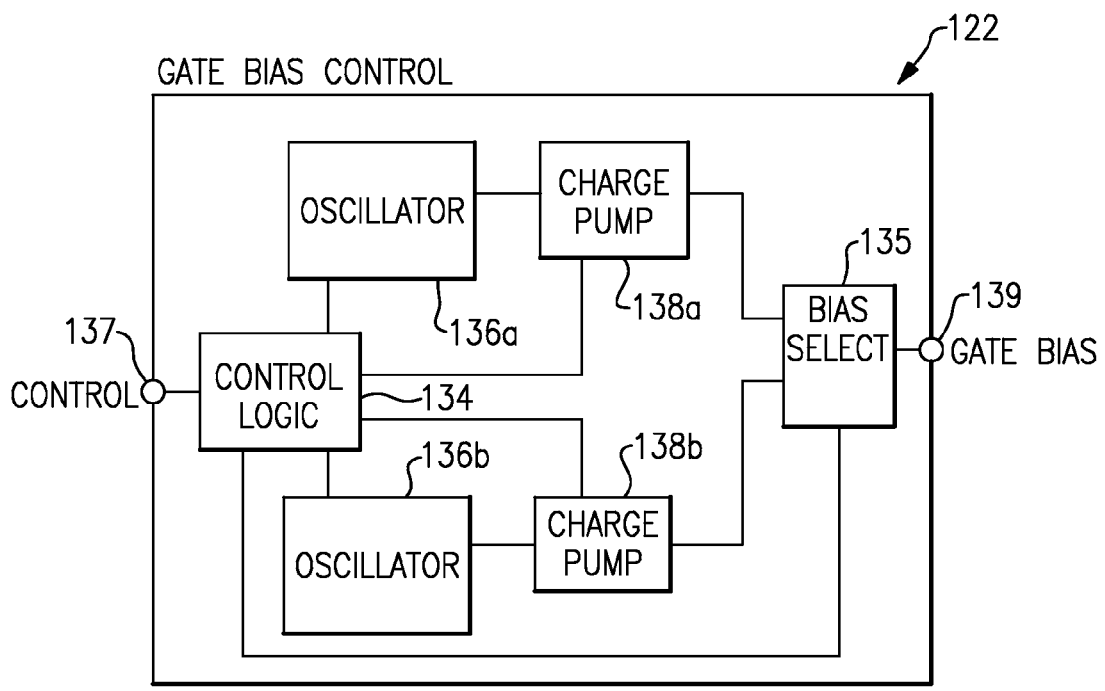
FIG. 8B is a schematic block diagram of a gate bias control block in accordance with one embodiment.

FIG. 8B is a schematic block diagram of a gate bias control block 122 in accordance with one embodiment. The gate bias control block 122 includes control logic 134, oscillators 136a, 136b, charge pumps 138a, 138b, and a bias select block 135. The control logic 134, the oscillators 136a, 136b, the charge pumps 138a-138b and the bias select block 135 can be electrically interconnected using one or more signals, and the gate bias control block 122 can receive and/or provide one or more signals from or to external circuitry. For example, the control logic 134 can receive control signals 137, and the bias select block 135 can provide a gate bias voltage 139. Additional details of the control logic 134, the oscillators 136a, 136b, and the charge pumps 138a, 138b can be similar to those described above with reference to FIG. 8A.

The bias select block 135 can set the gate bias 139 to a variety of voltage levels. For example, the bias select block 135 can set the gate bias 139 to the output voltage level of the charge pump 138a or to the output voltage level of the charge pump 138b. The bias select block 135 can receive one or more power supplies, ground supplies, or outputs of voltage regulators as inputs to aid in setting the gate bias 139 to a particular voltage level. Configuring the bias select block 135 to receive additional voltages can aid in setting the gate bias 139 to a desired voltage level associated with a particular switch state and/or power mode. For example, the bias select block 135 can deliver a boosted gate voltage to a switch in the ON state, and a relatively low voltage level to a switch in the OFF state. These voltage levels can be selected by controlling the output voltage levels of the charge pumps 138a, 138b.

The gate bias control block 122 can be configured to deliver gate bias voltages to a plurality of switches. For example, the gate bias block 122 can deliver gate bias voltage levels to two or more switches, each of which can have the same or different gate bias voltage levels. Thus, the bias select block 135 can include a plurality of gate bias outputs for biasing a plurality of switches.

With reference to FIGS. 8A-8B, in certain embodiments, the p-well bias control block 121 and the gate bias control block 122 can share one or more blocks so as to reduce circuit area and simplify design complexity. For example, the oscillator 136b and the charge pump 138b can be omitted from the gate bias control block 122, and the bias select block 135 of the gate bias control block 122 can be configured to receive the output of the charge pump 128 of the p-well bias control block 121. This can permit the gate bias control block 122 and the p-well bias control block 121 to have a substantially equal gate bias 139 and p-well bias 129, such as when biasing a switch in an OFF state. Sharing one or more blocks between the p-well bias control block 121 and the gate bias control block 122 can aid in reducing circuit area and complexity.

Figure 8C:
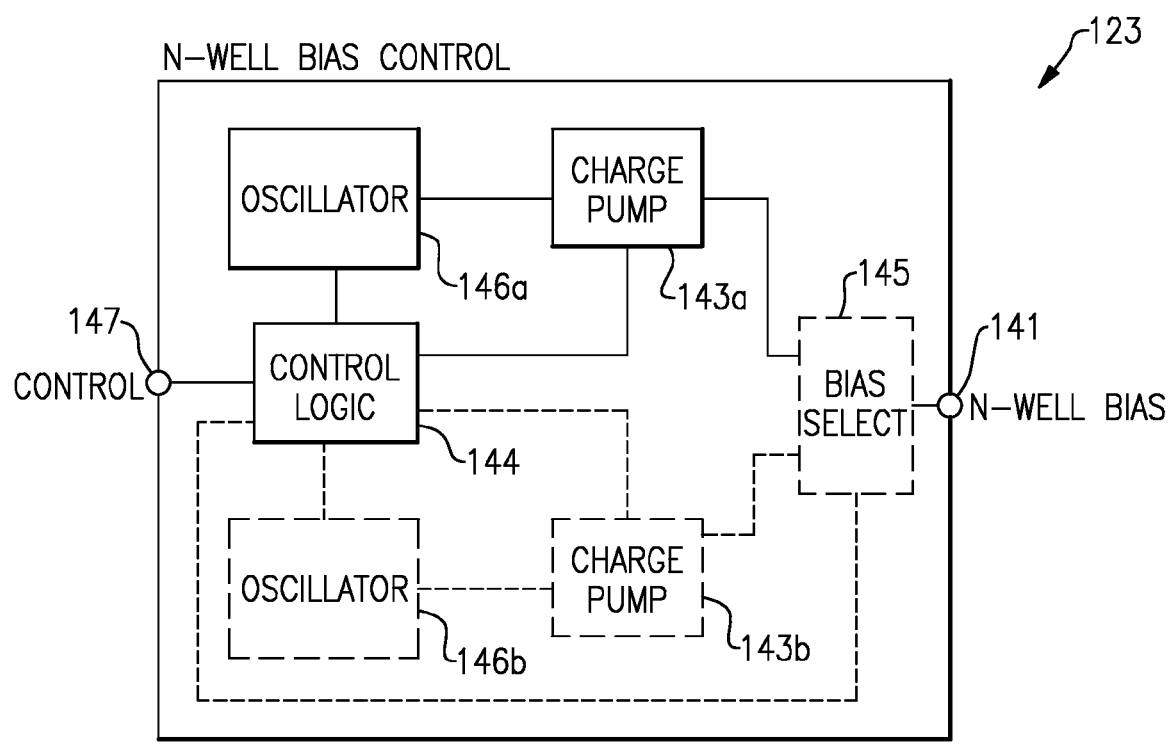
FIG. 8C is a schematic block diagram of a n-well bias control block in accordance with one embodiment.

FIG. 8C is a schematic block diagram of an n-well bias control block 123 in accordance with one embodiment. The gate bias control block 122 includes control logic 144, an oscillator 146a a charge pumps 143a. The control logic 144, the oscillator 146a and the charge pump 143a can be electrically interconnected using one or more signals, and the n-well bias control block 123 can receive and/or provide one or more signals from or to external circuitry. For example, the control logic 144 can receive control signals 147, and the charge pump 143a can provide a gate bias voltage 141. Additional details of the control logic 144, the oscillator 146a, and the charge pump 143a can be similar to those described above with reference to FIG. 8A.

The n-well bias 141 of the n-well bias control block 123 can be determined by the output of the charge pump 143a. The charge pump 143a can be configured to output a relatively high voltage so as to prevent the unintended forward biasing of parasitic diodes in switches receiving n-well bias 141. To provide additional control over the n-well bias 141, a bias select block 145, an oscillator 146b, and a charge pump 143b can also be included. The bias select block 145 can be configured to receive the outputs of the charge pumps 143a, 143b to aid in providing a desired voltage level to the n-well bias 141. The n-well bias 141 can be provided to one or more switches, similar to that described above. The voltage level of the n-well bias 141 can be varied to prevent the forward biasing of parasitic diode structures while also biasing the n-well bias 141 to reduce current leakage and to prevent junction breakdown.

Figure 9:
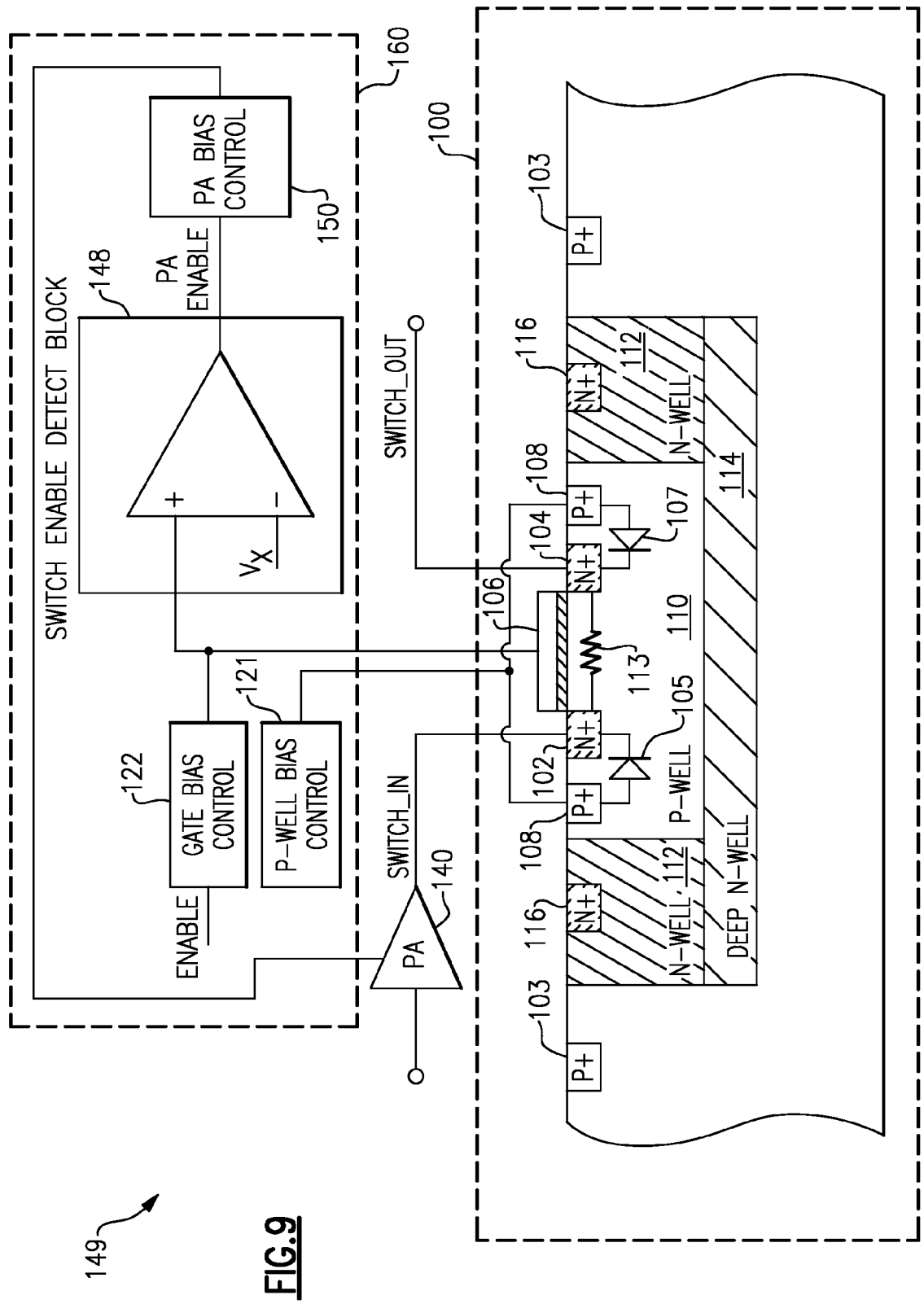
FIG. 9 is a schematic diagram of a power amplifier system in accordance with another embodiment.

FIG. 9 is a schematic diagram of a power amplifier system 149 in accordance with another embodiment. The illustrated power amplifier system 149 includes a switch 100, a bias control system 160, and a power amplifier 140. The switch 100 includes a substrate 101, substrate contacts 103, a p-well 110, p-well contacts 108, n-wells 112, deep n-well 114, n-well contacts 116, a source 102, a drain 104, a gate 106, and a resistor 113. The switch 100 has been annotated to show certain parasitic diode devices formed from the illustrated switch structure, including diodes 105, 107. Additional details of the switch 100 can be as described above.

The power amplifier 140 includes an input for receiving an RF input signal, and an output for generating an RF output signal, which can be an amplified version of the RF input signal. The power amplifier 140 can provide the RF output signal to the source 102 of the switch 100. The power amplifier 140 can receive one or more control signals, including an enable signal from the bias control system 160.

The bias control system 160 includes a p-well bias control block 121, a gate bias control block 122, a switch enable detect block 148 and a power amplifier control block 150. As shown in FIG. 9, the p-well bias control block 121 can provide a p-well bias voltage to the p-well 110 of the switch 100, and the gate bias control block 122 can provide a gate bias voltage to the gate 106 of the switch 100. The gate bias voltage can also be provided to the switch enable detect block 148, which can be configured to compare the gate bias voltage to a reference voltage Vx. The switch enable detect block 148 can generate a power amplifier enable signal based on this comparison, which can be provided to the power amplifier bias control block 150. The power amplifier bias control block 150 can be configured to control the bias of one or more power amplifiers, such as the power amplifier 140.

The power amplifier 140 can provide a quiescent current to the switch 100, even before the power amplifier 140 receives an RF input signal for amplification. The quiescent current can be provided to the switch 100, and a portion of the quiescent current can travel through the resistor 113. If the voltage drop across the resistor 113 is relatively large, the diode 107 can become forward biased and the switch 100 can drawn unnecessary current, which can increase insertion loss and reduce power amplifier gain.

To decrease the resistance between the source 102 and drain 104, the voltage level of the gate 106 can be increased before the power amplifier 140 is enabled. This can create a path for the quiescent current to travel which is in parallel to the current path provided by the resistor 113. By providing a sufficient voltage to the gate 106 before enabling the power amplifier 140, the resistance between the source 102 and drain 104 can be decreased before the switch 100 receives a quiescent current from the power amplifier 140 and the diode 107 can be prevented from becoming forward biased.

The switch enable detect block 148 can be used for controlling the power amplifier bias control block 150 to prevent the unintended forward biasing of the diode 107. For example, the switch enable detect block 148 can compare the level of the gate 106 to a reference voltage Vx that is indicative of the switch 100 being in an ON state. The switch enable detect block 148 can generate a comparison signal indicative of the result, and provide the comparison signal to the power amplifier bias control block 150. The power amplifier bias control block 150 can be configured to enable the power amplifier 140 after the comparison signal indicates the switch 100 is in an ON state.

Although the switch enable detect block 148 is shown as comparing the voltage level of the gate 106 to a reference voltage Vx, there are numerous other ways to indirectly compare the voltage level of the gate to a reference voltage without directly comparing the two voltage values. For example, in one embodiment, the gate bias control block 122 can us an enable or other control signal indicative of the voltage level of the gate 106 as a reference voltage signal. In another embodiment, the switch enable detect block 148 can compare a signal indicative of the gate being enabled, such as, for example, a current through or a voltage across a resistor or other device, which has a calculable relationship to the gate voltage level.

In one embodiment, the reference voltage Vx is selected to be equal to about the threshold voltage Vt of the switch 100. The threshold voltage Vt of the switch 100 can be the voltage at which an inversion layer forms on the surface of the p-well 110 adjacent the gate 106. By selected the reference voltage Vx to be equal to about Vt of the switch 100, the switch enable detect block 148 can be configured to detect if the gate voltage is at a voltage level greater than or equal to about Vt, which can correspond to the formation of an inversion layer in the switch 100 and a relatively low resistance between the source 102 and drain 104.

Figure 10A:
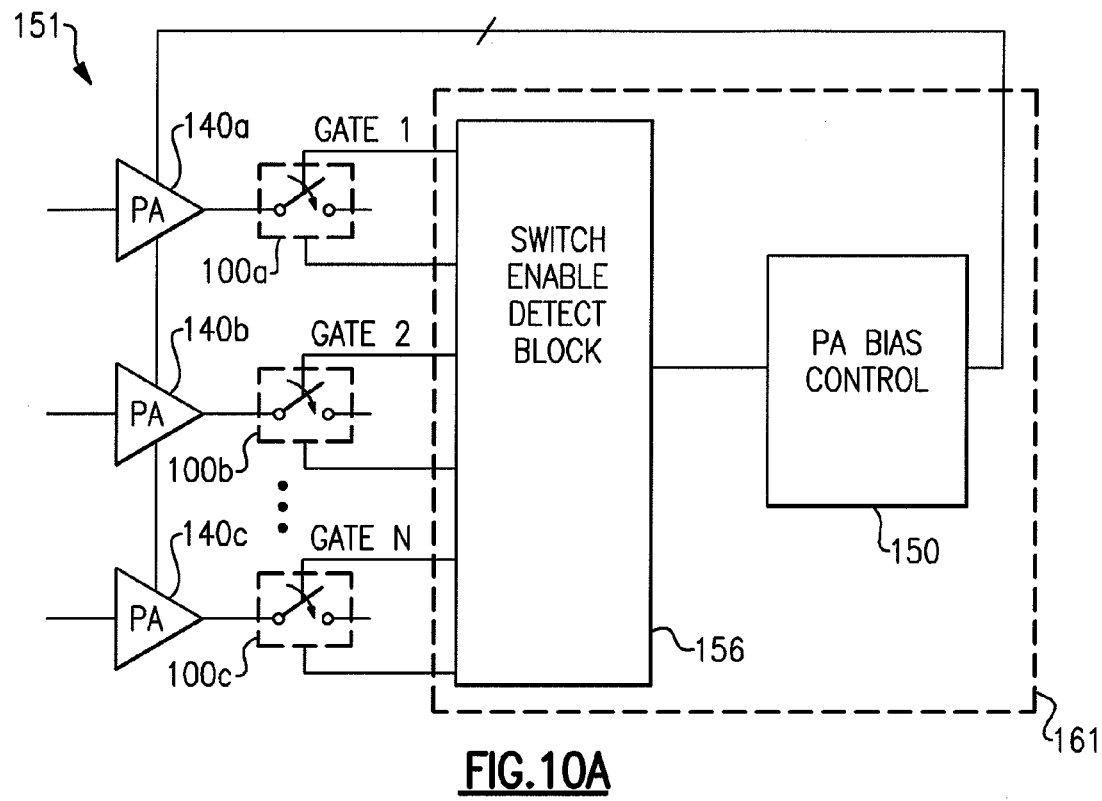
FIG. 10A is a schematic block diagram of a power amplifier system in accordance with another embodiment.

FIG. 10A is a schematic block diagram of a power amplifier system 151 in accordance with another embodiment. The illustrated power amplifier system 151 includes a first power amplifier 140a, a second power amplifier 140b, a third power amplifier 140c, a first switch 100a, a second switch 100b, a third switch 100c, and a bias control system 161. The bias control system 161 includes a switch enable detect block 156 and a power amplifier bias control block 150. As shown in FIG. 10A, the power amplifiers 140a-140c can drive the switches 100a-100c, respectively. Voltages indicative of the gate voltages of the switches 100a-100c can be provided to the switch enable detect block 156. Additionally, the switch enable detect block can receive one or more voltages indicative of the p-well voltages of the switches 140a-140c.

The switch enable detect block 156 can compare the gate voltages of the switches 100a-100c to the p-well voltages of the switches 100a-100c to generate one or more signals indicative of the switches 100a-100c being enabled. The signals can be provided to a power amplifier bias control block 150, which can control one or more power amplifiers, including, for example, the power amplifiers 140a-140c. Thus, the bias control system 161 can be configured to enable the power amplifiers 140a-140c after the switches 100a-100c are activated, thereby preventing the switches 100a-100c from receiving quiescent currents associated with the power amplifiers 140a-140c before being enabled. Although FIG. 10A illustrates a configuration in which the gate and p-well voltages of three switches are compared, the switch enable detect block 156 can be configured to monitor more or fewer switches.

Figure 10B:
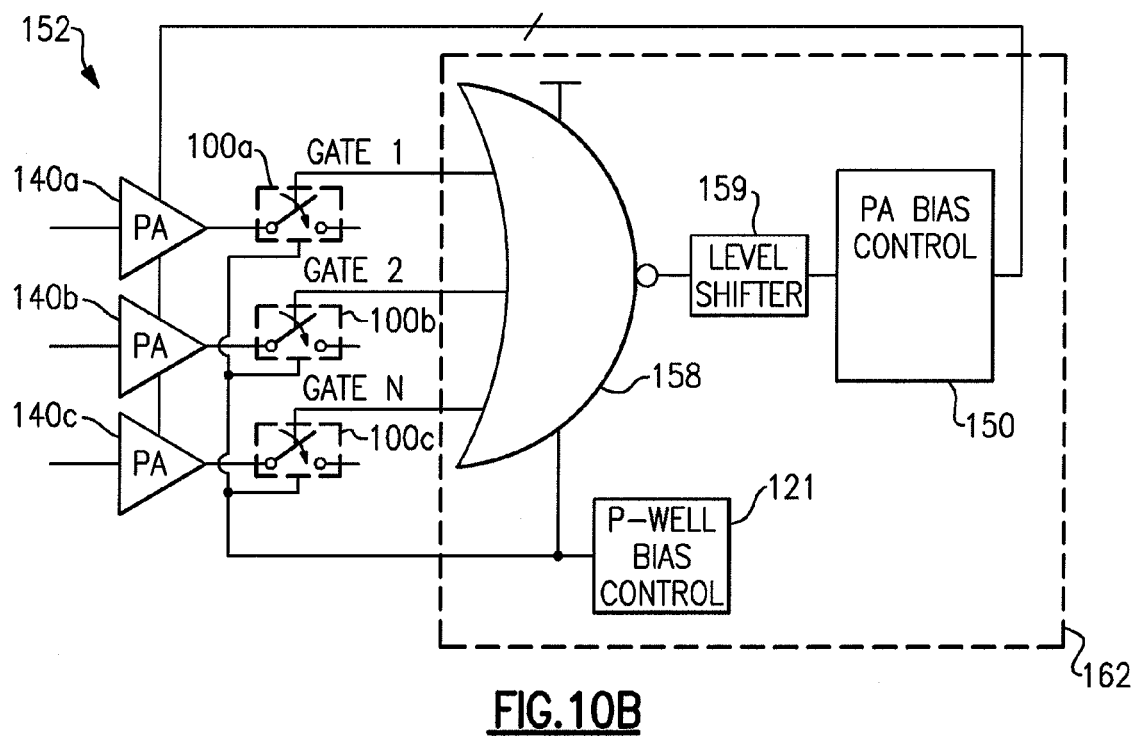
FIG. 10B is a schematic block diagram of a power amplifier system in accordance with another embodiment.

FIG. 10B is a schematic block diagram of a power amplifier system 152 in accordance with another embodiment. The illustrated power amplifier system 152 includes a first power amplifier 140a, a second power amplifier 140b, a third power amplifier 140c, a first switch 100a, a second switch 100b, a third switch 100c, and a bias control system 162. The bias control system 162 includes a p-well bias control block 121, a switch enable detect block 158, a level shifter 159, and a power amplifier bias control block 150. As shown in FIG. 10B, the power amplifiers 140a-140c can drive the switches 100a-100c, respectively. Voltages indicative of the gate voltages of the switches 100a-100c can be provided to the switch enable detect block 158. The p-well bias control block 121 can provide a p-well bias to the switches 100a-100c and to the switch enable detect block 158.

The switch enable detect block 158 can compare the gate voltages of the switches 100a-100c to the p-well voltage generated by the p-well bias control block 121. This can be accomplished using a digital logic gate, such as a NOR gate, as shown in FIG. 10B. For example, the NOR gate can include logic connected between a positive supply and a negative supply. The positive supply can be a relatively high voltage of the chip and can be, for example, equal to about the voltage of the gate of a switch in the enabled state. In embodiments in which a charge pump is used to supply the gate voltages of switches in the enabled state, the output of the charge pump can be used as the positive supply of the switch enable detect block 158. The negative supply can be configured to receive the p-well bias voltage. Thus, the switch enable detect block 158 can detect if at least one of the gate voltages of the switches 100a-100c is greater than the p-well bias voltage by at least about a threshold voltage Vt of the switches.

The output of the switch enable detect block 158 can be provided to a level shifter 159. The level shifter can reduce the voltage of the detected signal before providing the signal to the power amplifier bias control block 150. Reducing the voltage of the enable signal can be useful in embodiments in which the positive voltage supply of the switch enable detect block 158 exceeds the operating voltage of the power amplifier bias control block 150. For example, the power amplifier bias control block 150 can include one or more transistors having relatively thin gate oxides, and which can be susceptible to damage or reliability concerns if exposed to a relatively large voltage.

As described above, the switch enable detect block can include one or more digital logic gates configured to compare the gate voltage of one or more switches to the p-well bias voltage of one or more switches. Using digital logic techniques can reduce the complexity, area and power consumption of the switch enable detect block relative to an embodiment in which more sophisticated circuitry is employed. Although the switch enable detect block 158 is illustrated as a NOR gate in FIG. 10B, other digital logic gates can be used. For example, an inverter can be used to compare the gate voltage of a switch to the p-well bias voltage of the switch. Additionally, a NAND gate or other gate can be utilized if a different logic function is desired. For example, a NAND gate can be used to determine if all switches are enabled, rather than detecting the enablement of at least on of the switches 140a-140c.

In one embodiment, the switch enable detect block 158 is configured to detect a voltage level of about n*Vt above the voltage of the p-well, wherein n is an integer greater than or equal to one. This can be accomplished, for example, by inserting n−1 elements having a voltage drop equal to about Vt in series between the negative voltage supply of the switch enable detect block 158 and the p-well bias control block 121. For example, a NMOS device having a gate, a drain and a source can be connected in a diode configuration in which the gate and drain are electrically connected, and can have a voltage drop equal to about Vt. Accordingly, n−1 diode connected NMOS devices can be inserted in series between the negative voltage supply of the switch enable detect block 158 and the p-well bias control block, so that the switch enable detect block 158 can detect a voltage level of the gates of the switches 100a-100c greater than about n*Vt of the p-wells of the switches 100a-100c. By detecting increasingly higher voltage levels of the gate voltage relative to a p-well voltage of a switch, a channel resistance of the switch can achieve a selected value before the switch receives a quiescent current from a power amplifier.

Figure 11:
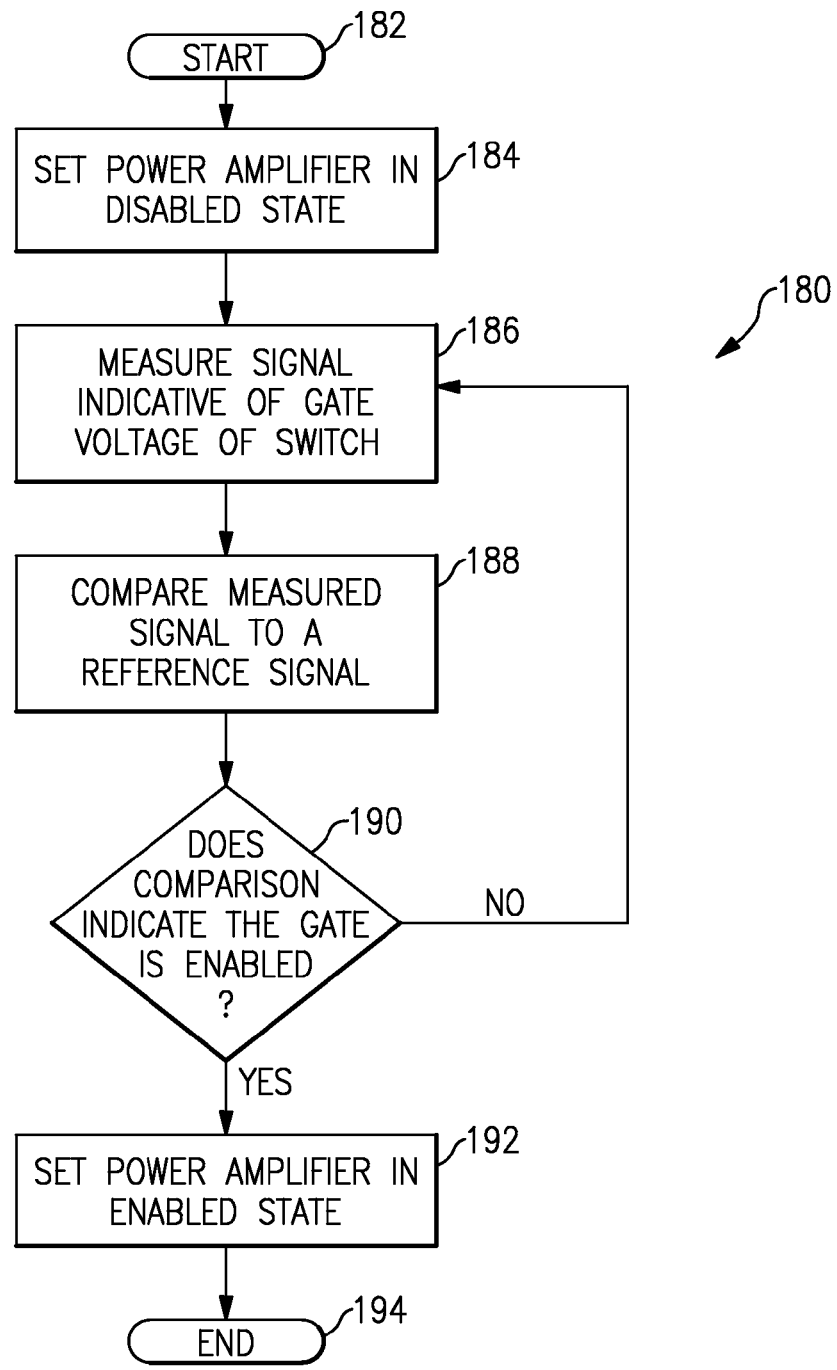
FIG. 11 is a method for biasing a power amplifier system in accordance with one embodiment.

FIG. 11 is a method 180 for biasing a power amplifier system in accordance with one embodiment. The method 180 is depicted from the point of view of a bias control system for a power amplifier system. It will be understood that the methods discussed herein may include greater or fewer operations and the operations may be performed in any order, as necessary. The illustrated method can be used to bias, for example, the power amplifier systems illustrated in FIGS. 3A-3B.

The method 180 for biasing a power amplifier system starts at 182. In an ensuing block 184, one or more power amplifiers are set in a disabled state. The power amplifiers can be configured to drive one or more switches. As described earlier, a power amplifier can provide a quiescent current to an associated switch, even before the power amplifier receives an RF input signal for amplification. The quiescent current can reach the switch, and can cause a voltage drop between the input and output of the switch. If the resistance of the channel of the switch is sufficiently high, the voltage drop can be large enough to forward bias a parasitic diode associated with the output of the switch. By disabling the power amplifiers in block 184, quiescent currents are prevent from being provided to the switches. This can prevent the switch from drawing current through a parasitic diode formation, thereby preventing an increase in power consumption, an increase insertion loss and a reduction in power amplifier gain.

The method 180 continues at a step 186, in which a signal indicative of the gate voltage of a switch is measured. The signal can be the gate voltage of the switch itself. However, the signal can also be a signal indicative of the gate voltage of the switch, such as an enable signal to a gate bias control block configured to bias the gate voltage of the switch. Alternatively, the signal can be a current through or a voltage across a resistor or other device, which has a calculable relationship to the gate voltage level.

In an ensuing block 188, the measured signal is compared to a reference signal. The measured signal can be compared to the reference signal by providing both signals to a comparator. Alternatively, the measured signal can be compared to the reference signal using a digital logic gate. For example, a reference voltage, such as a p-well voltage of a switch, can be configured to operate as a negative voltage supply of a digital logic gate, such as an inverter or NOR gate, and an input of the digital logic gate can receive the measured voltage. The digital logic gate can be configured to transition if the measured voltage is greater than about the threshold voltage Vt of a transistor.

The method 180 continues at a decision block 190, in which the bias control system determines if the gate of one or more switches is enabled. This can be determined, for example, by using the result of a comparator or digital logic gate configured to compare the measured signal to the reference signal. For example, in one embodiment a digital gate is configured to determine if the measured signal is at least a Vt above the reference signal. In another embodiment, the measured signal is compared to the reference signal using an analog comparator circuit. If the answer to the inquiry in the decision block 190 is no, the method returns to the block 186. If the answer to the inquiry in the decision block 190 is yes, the method proceeds to the block 192, in which one or more power amplifiers is set in an enabled state. As described above, ensuring the gate of a switch is enabled before enabling a power amplifier can aid in enabling a gate of a switch before the switch receives a quiescent current of the power amplifier. This can prevent the forward bias of parasitic diode structures in the switch. The method ends at 194.

Overview of N-Diffusion Sensing Systems

Figure 12:
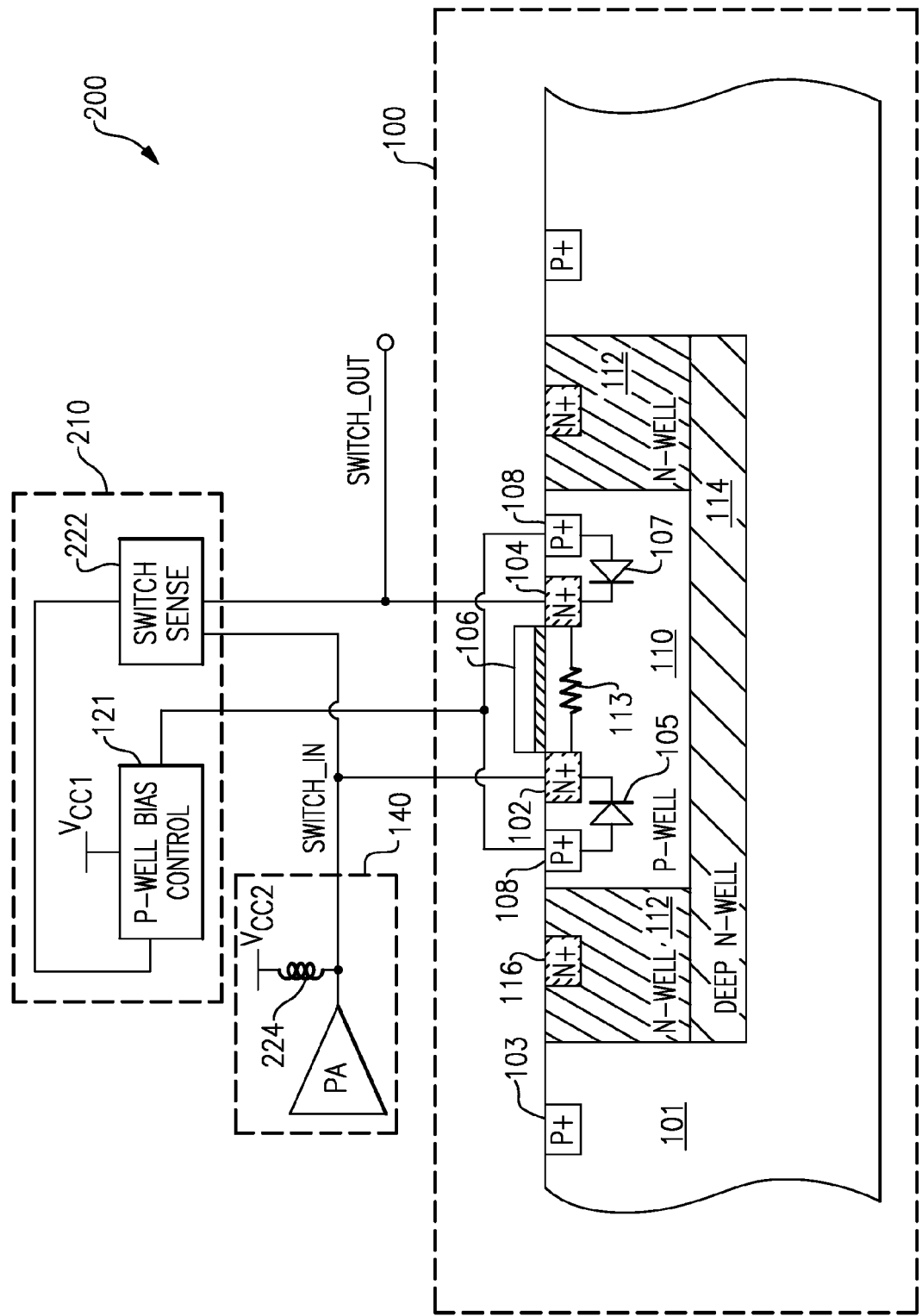
FIG. 12 is a schematic diagram of part of a power amplifier system in accordance with another embodiment.

FIG. 12 is a schematic diagram of part of a power amplifier system 200 in accordance with another embodiment. The power amplifier system 200 includes a switch 100, a power amplifier 140, and a bias control system 210. The bias control system 210 includes a p-well bias control block 121 and a switch sense block 222. The switch 100 includes a substrate 101, substrate contacts 103, a p-well 110, p-well contacts 108, n-wells 112, deep n-well 114, n-well contacts 116, a source 102, a drain 104, a gate 106, and a resistor 113. Additional details of the switch 100 can be as described above. The power amplifier 140 can receive an RF input signal, and can amplify the RF input signal to produce an RF output signal. The source 102 of the switch 100 can be configured to receive the RF output signal from the power amplifier 140.

The p-well bias control block 121 can provide a p-well bias voltage to the p-well 110 of the switch 100, and the switch sense block 222 can be electrically connected to the switch input and/or output of the switch 100. Additional details of the switch sense block 222 will be described below. Although the bias control system 120 is illustrated as biasing only a single switch 100 in FIG. 12, the bias control system 210 can bias one or more additional switches.

The switch 100 has been annotated to show certain devices formed from the illustrated switch layout structure, including diodes 105, 107. The diode 105 includes an anode formed from the p-well 110, and a cathode formed from the source 102. The diode 107 includes an anode formed from the p-well 110 and a cathode formed from the drain 104. As will be described in further detail below, the p-well bias control block 121 can bias the p-well 110 to provide enhanced control over the switch 100 and to prevent unintended biasing of the diodes 105, 107.

The power amplifier 140 can bias the source 102 of the switch 100. For example, the power amplifier 140 can include an RF choke 224 to bias the source 102 of the switch 100. The RF choke 224 can be, for example, an inductor configured to provide a DC bias voltage to source 102 while having relatively high impedance for RF signals.

Without sufficiently controlling the p-well bias control block 121, there can be a danger that the p-well bias control block 121 can bias the voltage of the p-well 110 before the power amplifier 140 biases the source 102 of the switch 100. For example, the power amplifier 140 and the p-well bias control block 121 can be electrically connected to different voltage supplies to prevent switching noise generated by the power amplifier 140 from being injected into the p-well bias control block 121. Thus, the p-well bias control block can be electrically connected to a power supply $V_{CC1}$ and the power amplifier can be electrically connected to a power supply $V_{CC2}$. Accordingly, there can be a danger that the p-well bias control block 121 can bias the p-well 110 before the power amplifier 140 receives power. This can result in the diodes 105 and/or the diode 107 becoming forward biased.

It can be difficult to control the sequencing of the power supplies $V_{CC1}$ and $V_{CC2}$, such as in embodiments where the power amplifier 140 and the p-well bias control block 121 are on different dies. For instance, with reference back to FIG. 3A, the power amplifier can be present on die 24a and the switch 100 and p-well bias control block 121 can be present on die 23. Thus, the die 23 may receive power before the die 24a. Additionally, in certain embodiments, the die 23 may not have a pin or pad configured to receive the supply voltage $V_{CC2}$, and thus cannot directly measure the supply voltage $V_{CC2}$.

In one embodiment, the switch sense block 222 is configured to sense the source 102 and/or drain 104 of the switch 100, and to provide one or more signals indicative of the result to the p-well bias control block 121. The p-well bias control block 121 can be configured to bias the p-well 100 after the switch sense block 222 has determined that the source 102 and/or drain 104 is greater than a preselected reference voltage level. Thus, the switch sense block 222 can be advantageously employed to prevent the forward biasing of diodes 105, 107.

Figure 13A:
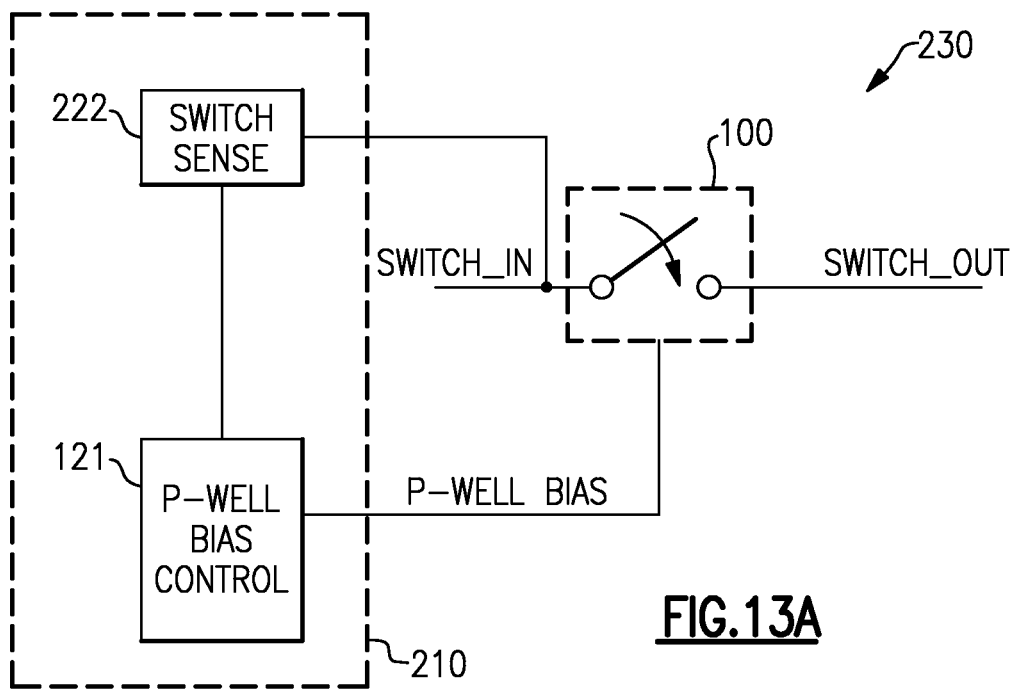
FIG. 13A is a schematic block diagram of a power amplifier system in accordance with another embodiment.

FIG. 13A is a schematic block diagram of a power amplifier system 230 in accordance with another embodiment. The power amplifier system 230 includes a bias control system 210 and a switch 100. The bias control system 210 includes a switch sense block 222 and a p-well bias control block 210. As shown in FIG. 13A, the p-well bias control block 121 can be configured to provide a p-well bias voltage to the switch 100. The switch sense block 222 can be configured to monitor a voltage of the input switch, and can be configured to provide one or more control signals to the p-well bias control block 121. Although the switch sense block 222 is illustrated as monitoring only a single switch 100, the switch sense block 222 can monitor additional switches. The same or different p-well bias control block 121 can be used to bias the p-well voltage of the additional switches. As shown in FIG. 13A, the switch sense block 222 can be configured to detect the voltage level at the input of the switch 100.

Figure 13B:
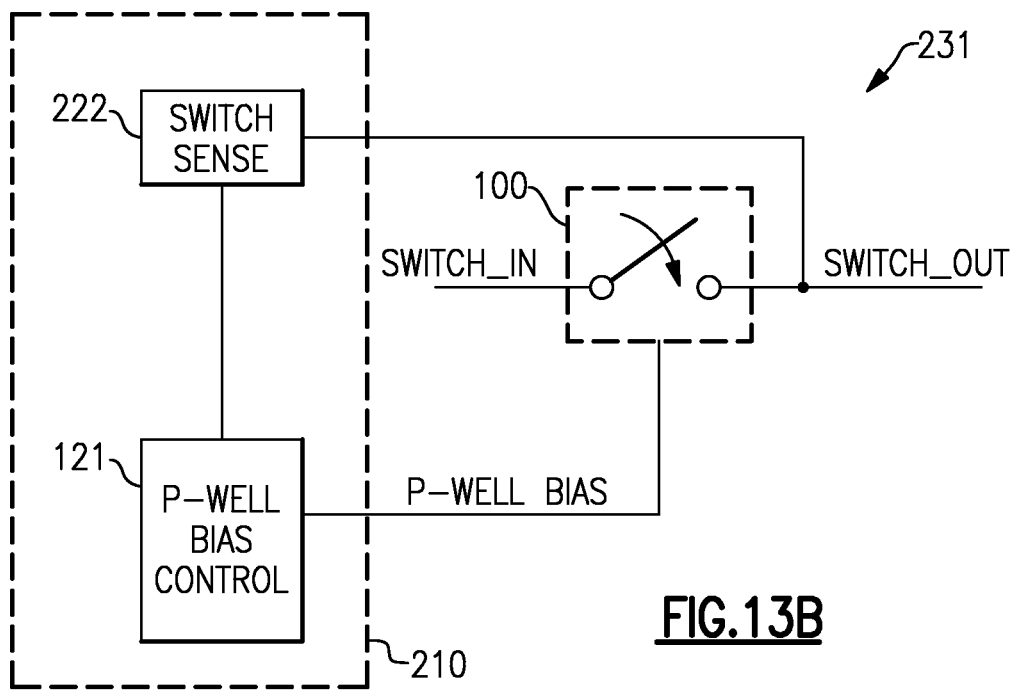
FIG. 13B is a schematic block diagram of a power amplifier system in accordance with another embodiment.

FIG. 13B is a schematic block diagram of a power amplifier system 231 in accordance with another embodiment. The power amplifier system 231 includes a bias control system 210 and a switch 100. The power amplifier system 231 is similar to the power amplifier system 230 of FIG. 13A, except the power amplifier system 231 includes a switch sense block 222 configured to receive the output of the switch 100.

Figure 13C:
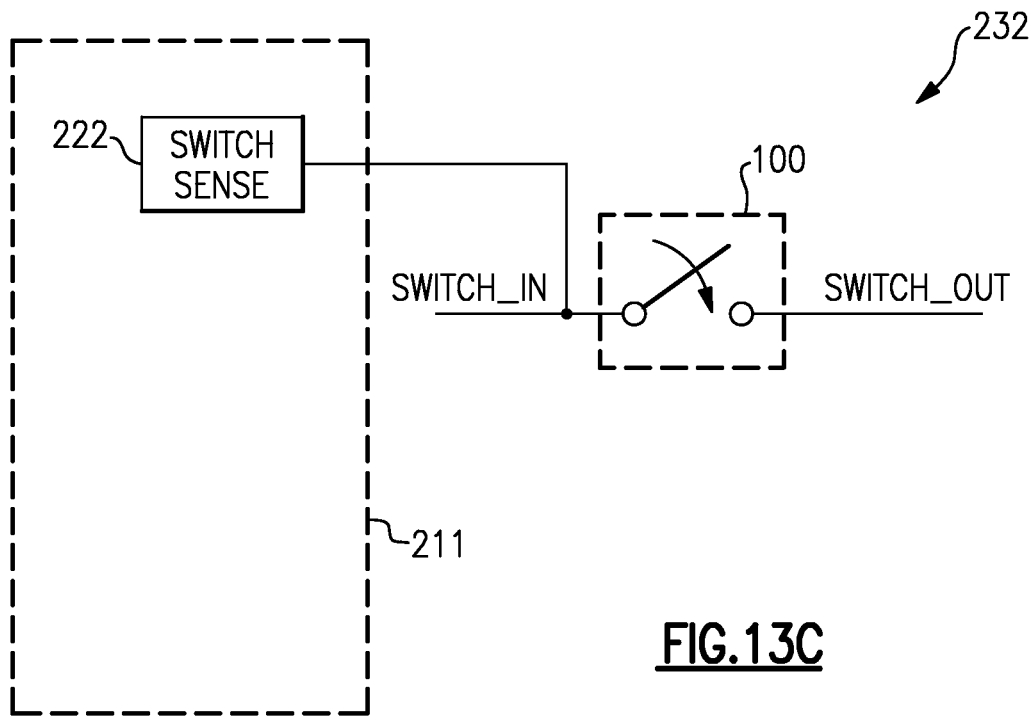
FIG. 13C is a schematic block diagram of a power amplifier system in accordance with another embodiment.

FIG. 13C is a schematic block diagram of a power amplifier system 232 in accordance with another embodiment. The power amplifier system 232 includes a bias control system 211 and a switch 100. The bias control system 211 includes a switch sense block 222. The switch sense block 222 can be configured to monitor a voltage of the input switch. In contrast to the power amplifier system 230 of FIG. 13A, the power amplifier system 231 of FIG. 13C need not include a p-well bias control system. For example, the switch 100 of FIG. 13C can have a floating p-well and the bias of the n-diffusion can be controlled over a variety of power modes and/or switch settings to prevent forward biasing of parasitic diode structures. The switch sense block 222 can be used to detect the voltage at the input to the switch, which can, for example, aid in biasing the switch 100.

Figure 13D:
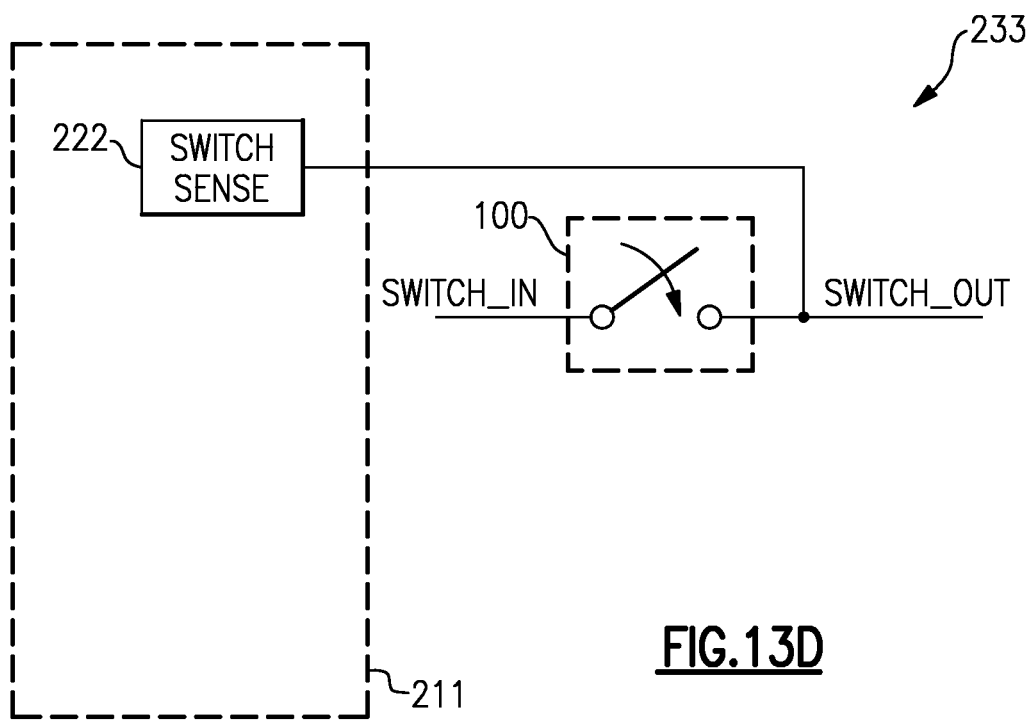
FIG. 13D is a schematic block diagram of a power amplifier system in accordance with another embodiment.

FIG. 13D is a schematic block diagram of a power amplifier system 233 in accordance with another embodiment. The power amplifier system 233 includes a bias control system 211 and a switch 100. The power amplifier system 233 is similar to the power amplifier system 232 of FIG. 13C, except the power amplifier system 233 includes a switch sense block 222 configured to receive the output of the switch 100.

Figure 13E:
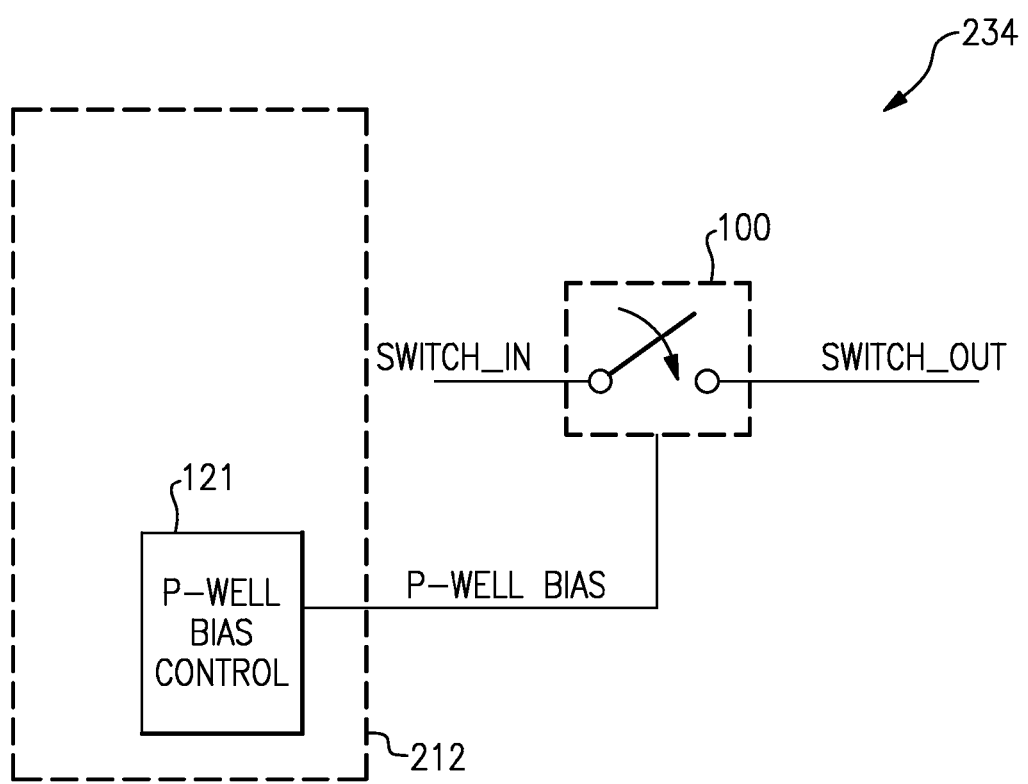
FIG. 13E is a schematic block diagram of a power amplifier system in accordance with another embodiment.

FIG. 13E is a schematic block diagram of a power amplifier system 234 in accordance with another embodiment. The power amplifier system 234 includes a bias control system 212 and a switch 100. The power amplifier system 234 includes a p-well bias control block 212 configured to bias the p-well of switch 100. In contrast to the power amplifier systems of FIGS. 13A-13D, the power amplifier system 234 of FIG. 13E need not include a switch sense block 222. The power amplifier system 234 can receive the input of the switch 100 to aid in biasing and control of the switch 100.

The power amplifier system can receive the output of the switch 100 to aid in biasing and control of the switch 100.

Although the power amplifier systems 230-234 of FIGS. 13A-13E are shown as receiving either the input or output of the switch 100, the power amplifier systems can be configured to receive both the input and output of the switch 100 to further aid in biasing and controlling of the switch 100.

Figure 14A:
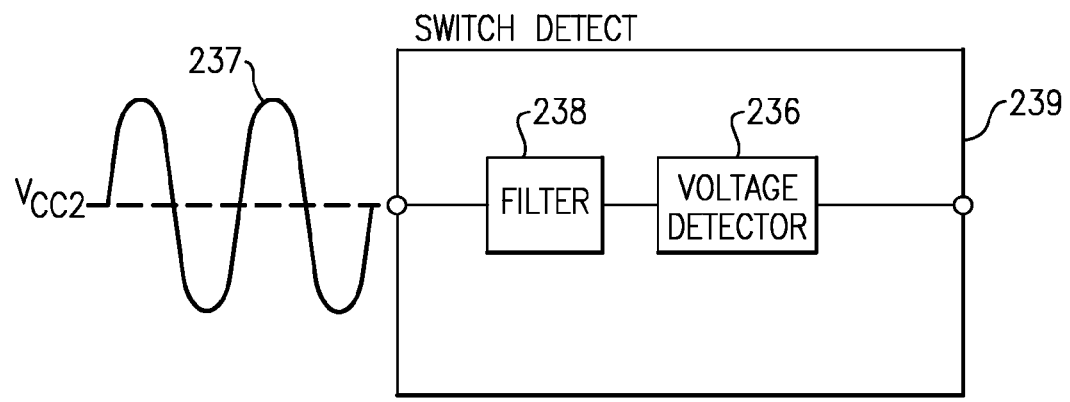
FIG. 14A is a schematic block diagram of a switch sense block in accordance with one embodiment.
Figure 14B:
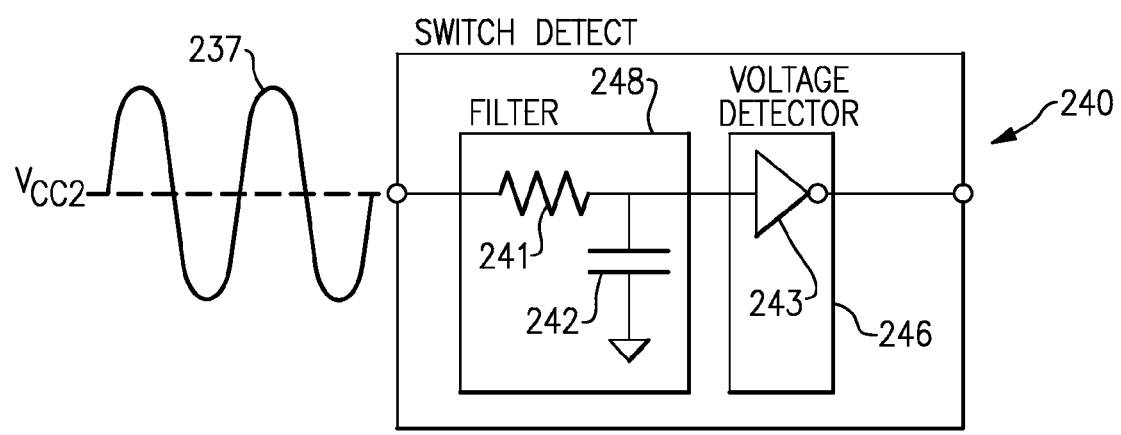
FIG. 14B is a schematic block diagram of a switch sense block in accordance with another embodiment.

FIGS. 14A-14B are schematic block diagrams of various embodiments of switch sense blocks. One or more of the switch sense blocks of FIGS. 14A-14B can be used in the power amplifier systems described above, and each switch sense block can be electrically to the input or output of a switch. The outputs of the switch sense blocks can be connected to control logic or other circuitry to aid in biasing the one or more switches.

FIG. 14A is a schematic block diagram of a switch sense block 239 in accordance with one embodiment. The switch sense block 239 includes a filter 238 and a voltage detector 236. The switch sense block 239 can be electrically connected to the source or drain of a switch, and thus can receive an RF signal 237 from a power amplifier or other source. The RF signal 237 can include an AC component and a DC component. The filter 238 can be a low-pass filter configured to filter at least a portion of the AC component of the RF signal 237 and provide the filtered signal to the voltage detector 236. The voltage detector 237 can compare the output of the filter 238 to a reference voltage level, and provide an output signal indicative of the comparison. The output of the voltage detector 237 can be provide to one or more blocks, such as the p-well bias control block 121 of FIGS. 12-13B.

FIG. 14B is a schematic block diagram of a switch sense block 240 in accordance with another embodiment. The switch sense block 240 includes a filter 248 and a voltage detector 246, and can receive a RF signal 237 as described above. The filter 248 includes a resistor 241 and a capacitor 242. The resistor includes a first end electrically configured to receive the RF signal 237, and a second end electrically connected to the voltage detector 246 and to a first terminal of the capacitor 242. The capacitor 242 further includes a second terminal electrically connected to a supply voltage. The resistor 241 and capacitor 242 can attenuate the power of the RF signal 237 at a cutoff frequency equal to about $1/(2\pi RC)$ Hertz. Thus, the resistance of the resistor 241 and the capacitance 242 can be selected based on the frequency of the RF signal 237, which can be determined, for example, based on a communication standard used to generate the RF signal 237.

The voltage detector 246 includes an inverter 243 having an input configured to receive a filtered signal from the filter 248, and an output for providing a switch sense signal to one or more blocks, such as one or more p-well bias control blocks 121. The inverter 243 can be configured to operate on a power supply greater than the DC voltage of the RF signal 237, and have a trip point selected to be below the DC voltage of the RF signal 237. Thus, the switch sense block 240 can be connected to the input or output of a switch, and can determine if the input or output of the switch is biased by a power amplifier. Accordingly, with reference back to FIG. 12, the switch sense block 240 can be employed to prevent the p-well bias control block 121 from biasing the p-well 100 before the power amplifier 140 biases the source 102 of the switch 100. This can prevent the forward biasing of diodes 105, 107, as describe earlier.

The switch sense block can use other filters or voltage detection blocks. For example, the filter 238 can be a multipole filter with or without an amplifier. Likewise, the voltage detector block can be a comparator or any other suitable block.

Figure 15:
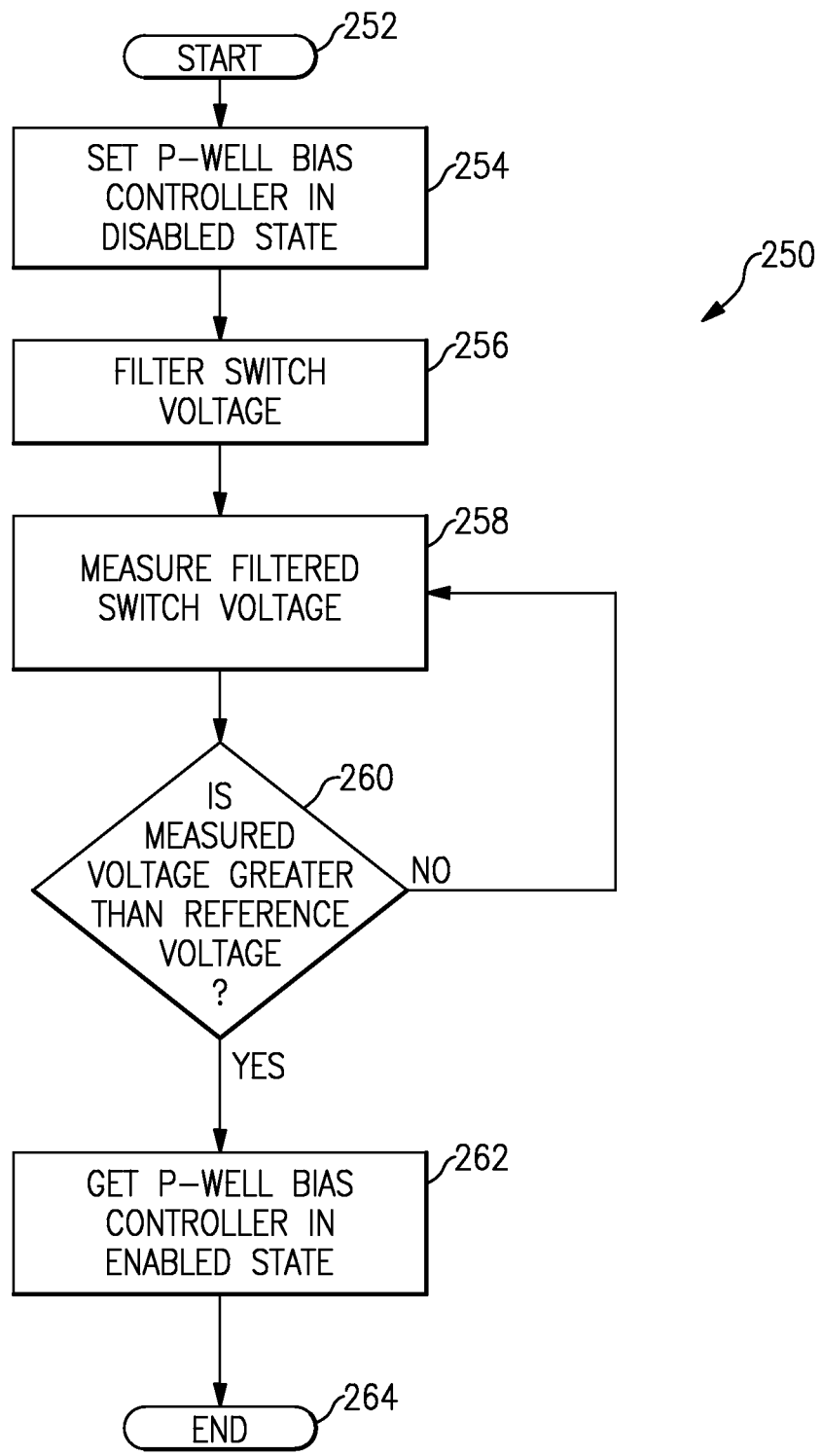
FIG. 15 is a method for biasing a power amplifier system in accordance with another embodiment.

FIG. 15 is a method 250 for biasing a power amplifier system in accordance with one embodiment. The method 250 is depicted from the point of view of a bias control system for a power amplifier system. It will be understood that the methods discussed herein may include greater or fewer operations and the operations may be performed in any order, as necessary. The illustrated method can be used to bias, for example, the power amplifier systems illustrated in FIGS. 3A-3B and 12-13B.

The method 250 for biasing a power amplifier system starts at 252. In an ensuing block 254, one or more p-well bias controllers are set in a disabled state. The p-well bias controllers can bias the p-wells of one or more switches. As described earlier, a power amplifier can provide a bias voltage to an input of an associated switch using, for example, an RF choke. The switch can include a resistor which can bias the output of the switch to a bias voltage equal to about the input bias voltage. By disabling a p-well bias control block in block 254, the p-well bias control block is prevented from activating before the power amplifiers, thereby preventing unintended forward-biasing of parasitic diode devices associated with the switch.

The method 250 continues at a block 256, in which a signal indicative of the input and/or output voltage of a switch is filtered. For example, the switch input or output voltage can be filtered using a low pass filter. Alternatively, the signal can be a current through or a voltage across a resistor or other device, which has a calculable relationship to the switch input or output voltage level.

In an ensuing block 258, the filtered switch input or output voltage is measured. In decision block 260, the measured switch input or output voltage is compared to a reference voltage. This comparison can be performed using an inverter configured to receive the filtered switch voltage and compare the filtered switch voltage to the trip point voltage of the inverter. However, this comparison can be performed in other ways. For example, the filtered switch voltage can be provided to an analog comparator. If the measured switch voltage is less than a reference voltage, the method 250 returns to the block 258.

If the measured switch voltage is greater than the reference voltage, the method 250 proceeds to a block 262, in which one or more p-well bias controllers are set in an enabled state. As described above, ensuring the input or output of a switch is biased before enabling a p-well bias controller can aid in preventing the forward biasing of parasitic diode structures in the switch. The method ends at 264.

Overview of P-Well Buffer Systems

Figure 16:
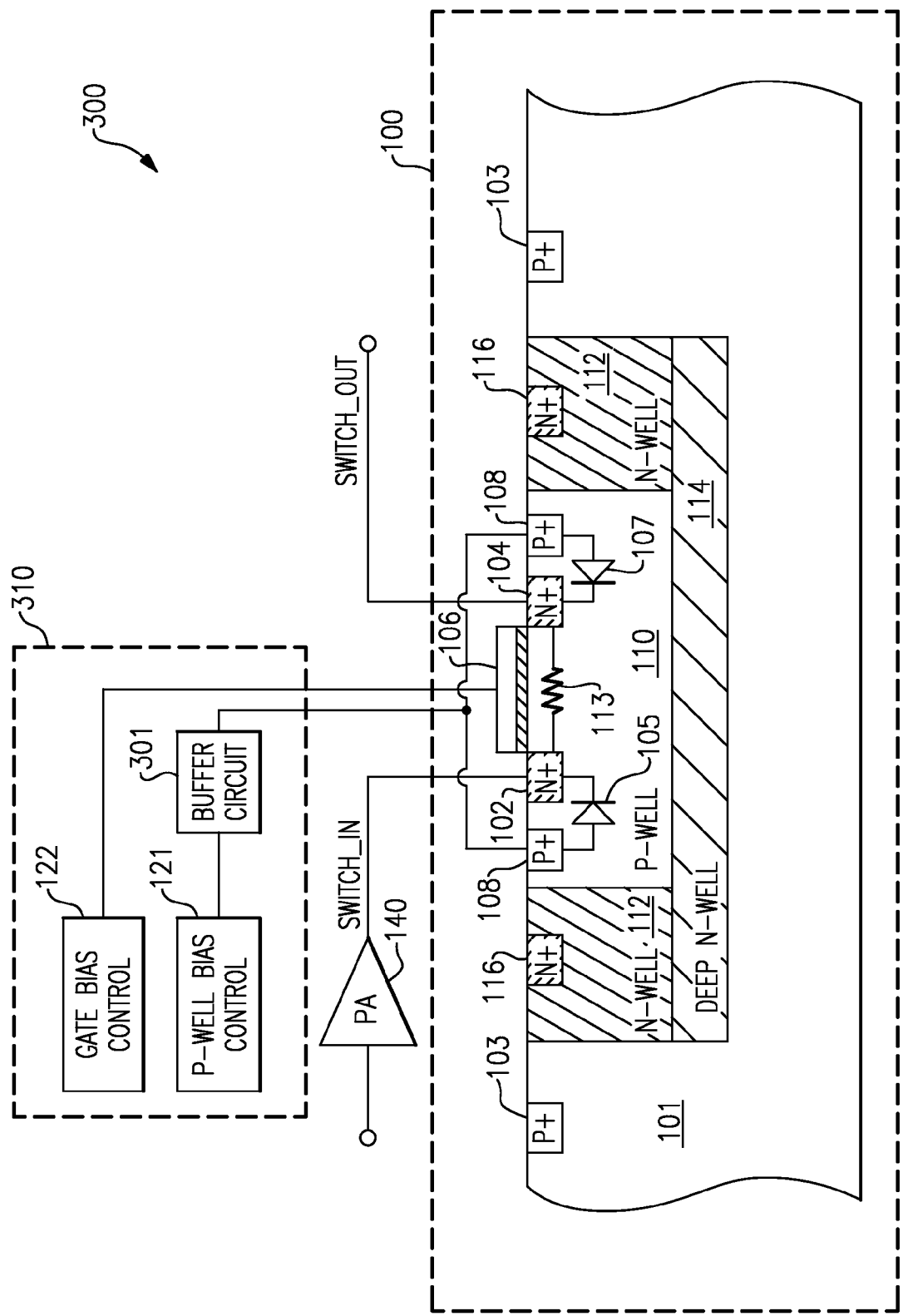
FIG. 16 is a schematic diagram of a power amplifier system in accordance with another embodiment.

FIG. 16 is a schematic diagram of a power amplifier system 300 in accordance with another embodiment. The power amplifier system 300 includes a switch 100, a bias control system 310 and a power amplifier 140. The bias control system 310 includes a p-well bias control block 121, a gate bias control block 122, and a buffer circuit 301. The switch 100 includes a substrate 101, substrate contacts 103, a p-well 110, p-well contacts 108, n-wells 112, deep n-well 114, n-well contacts 116, a source 102, a drain 104, a gate 106, and a resistor 113. The switch 100 has been annotated to show certain parasitic diode devices formed from the illustrated switch layout structure, including diodes 105, 107. Additional details of the switch 100 can be as described earlier.

The p-well bias control block 121 can provide a p-well bias voltage to the p-well 110 of the switch 100 through the buffer circuit 301, and the gate bias control block 121 can provide a gate bias voltage to the gate 106 of the switch 100. Although the bias control system 120 is illustrated as biasing only a single switch 100 in FIG. 16, the bias control system 120 can be configured to bias one or more additional switches using either the same or different bias control blocks 121, 122.

As was described earlier, the switch 100 can be selectively biased depending on the state of the switch. For example, the switch 100 can be biased in an OFF state in which the p-well voltage and the gate voltage are both relatively low. Additionally, the switch 100 can be biased in an ON state in which the p-well voltage is set at a relatively high voltage, such as a voltage equal to about that of the source 102 and drain 104, and the gate voltage can be placed at an even greater voltage so as to form a conductive channel between the source 102 and drain 104. When transitioning from an OFF state to an ON state, or when setting the switch in an ON state during start-up of the power amplifier system 300, the p-well bias control block 121 and the gate bias control block 122 can increase the voltages of the p-well 110 and the gate 106, respectively.

In certain embodiments, the capacitance of the gate 106 can be greater than the capacitance of the p-well 100. Thus, if the p-well bias control block 121 and gate bias control block 122 are not sufficiently controlled, there can be a danger that the voltage of the p-well 110 may rise faster than the voltage of the gate 106 and that the power amplifier 140 provides a quiescent current to the switch 100 before the switch 100 is biased in the ON state. The quiescent current can be received at the source 102 of the switch 100 and can travel across the resistor 113. The voltage drop across the resistor 113 can be relatively large and can reduce the voltage of the drain 104, thereby forward-biasing the diode 107.

In one embodiment, the buffer circuit 301 is included between the p-well bias control block 121 and the p-well 110 of the switch 100. Inclusion of the buffer circuit 301 can increase the impedance between the p-well bias control block 121 and the p-well 110, thereby reducing the rise time of the voltage of the p-well 110 relative to that of the gate voltage 106 and improving control of the biasing of the switch 100.

Figure 17A:
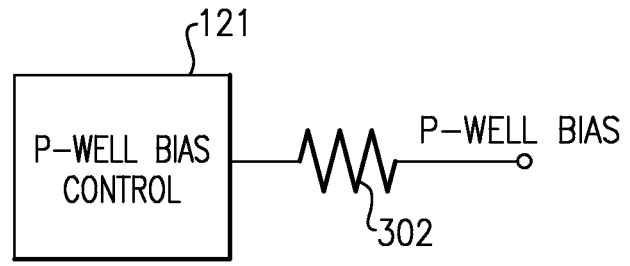
FIG. 17A is a schematic diagram of a p-well bias control block having a buffer circuit in accordance with one embodiment.

FIG. 17A is a schematic diagram of a p-well bias control block having a buffer circuit in accordance with one embodiment. The illustrated p-well bias control block 121 includes a resistor 302 configured to serve as buffer circuit. The resistor 302 includes a first end electrically connected to the p-well bias control block 121, and a second end configured to deliver a p-well bias voltage. The resistor 302 can be configured to have a relatively high resistance, so as to increase the impedance between the p-well bias control block 121 and one or more p-wells that the p-well bias control block 121 is configured to bias. In one embodiment, the resistor 302 has a resistance ranging between about 10 kΩ to about 200 kΩ.

Figure 17B:
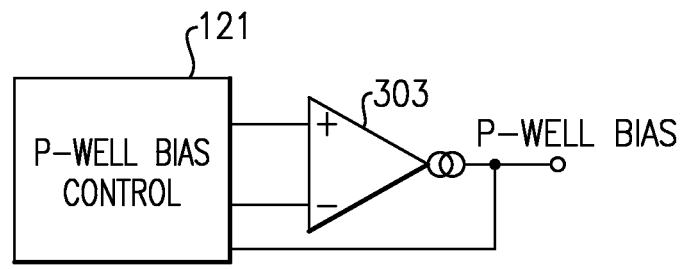
FIG. 17B is a schematic diagram of a p-well bias control block having a buffer circuit in accordance with another embodiment.

FIG. 17B is a schematic diagram of a p-well bias control block having a buffer circuit in accordance with another embodiment. The illustrated p-well bias control block 121 includes a transconductance amplifier 303 configured to serve as buffer circuit. The transconductance amplifier 303 includes a positive input, a negative input, and an output. The amplifier output is configured to deliver a current to one or more p-wells. By adjusting the voltage of the positive input relative to the voltage of the negative input, the amount of current generated by the transconductance amplifier 303 can be controlled. As shown in FIG. 17B, the p-well bias control block 121 can control the positive and negative input of the amplifier 303 to control the current delivered to the p-well, and can receive the p-well bias voltage to aid in improving control of the amplifier 303.

Figure 17C:
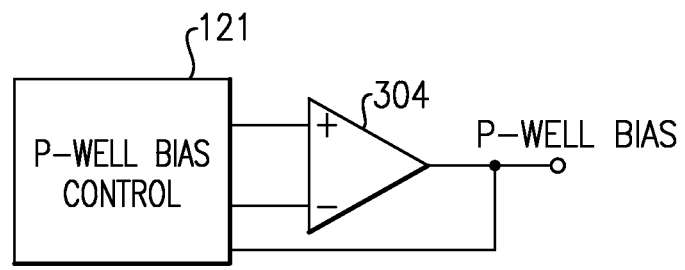
FIG. 17C is a schematic diagram of a p-well bias control block having a buffer circuit in accordance with yet another embodiment.

FIG. 17C is a schematic diagram of a p-well bias control block having a buffer circuit in accordance with yet another embodiment. The illustrated p-well bias control block 121 includes a operational amplifier 304 configured to serve as buffer circuit. The operational amplifier 304 includes a positive input, a negative input, and an output. The amplifier output is configured to deliver a voltage to one or more p-wells. By adjusting the voltage of the positive input relative to the voltage of the negative input, the amount of current generated by the operational amplifier 304 can be controlled. The p-well bias control block 121 can control the positive and negative input of the amplifier 303 to control the current delivered to the p-well, and can receive the p-well bias voltage to aid in improving control of the amplifier 304.

Figure 17D:
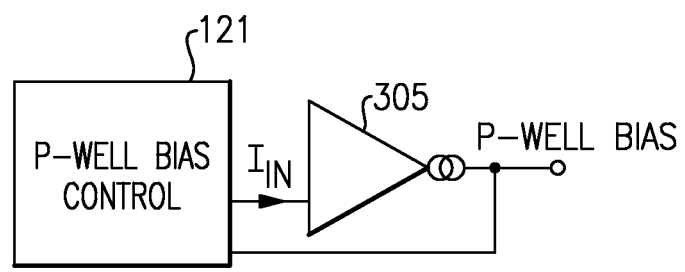
FIG. 17D is a schematic diagram of a p-well bias control block having a buffer circuit in accordance with still yet another embodiment.

FIG. 17D is a schematic diagram of a p-well bias control block having a buffer circuit in accordance with yet another embodiment. The illustrated p-well bias control block 121 includes a current controlled current source 305 configured to serve as buffer circuit. The current controlled current source 305 can deliver a current to one or more p-wells, which can be adjusted the p-well bias control block 121. The p-well bias control block 121 can receive the p-well bias voltage to aid in improving control of the current controlled current source 305.

Although FIGS. 17-17D illustrate four implementations of a buffer circuit for a p-well bias control block, other configurations are possible. For example, a current controlled voltage source can be placed in a negative feedback configuration having a controlled output drive.

Overview of P-Well Bias Disable Systems

Figure 18:
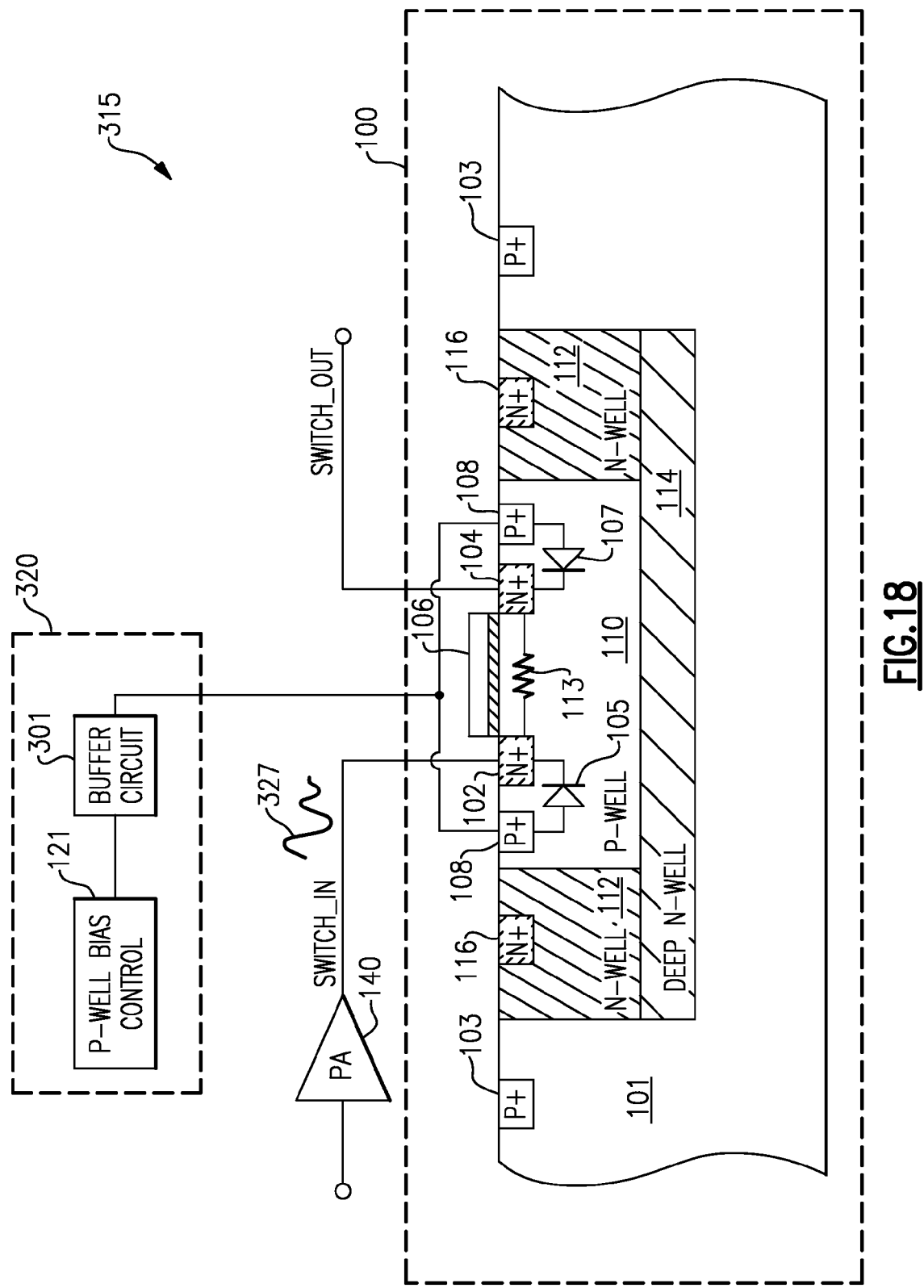
FIG. 18 is a power amplifier system in accordance with another embodiment.

FIG. 18 is a power amplifier system 315 in accordance with another embodiment. The power amplifier system 315 includes a switch 100, a power amplifier 140 and a bias control system 320. The bias control system 320 includes a p-well bias control block 121 and a buffer circuit 301. The switch 100 includes a substrate 101, substrate contacts 103, a p-well 110, p-well contacts 108, n-wells 112, deep n-well 114, n-well contacts 116, a source 102, a drain 104, a gate 106, and a resistor 113. The switch 100 has been annotated to show certain devices formed from the illustrated switch layout structure, including diodes 105, 107. Additional details of the switch 100 can be as described earlier.

The p-well bias control block 121 can provide a p-well bias voltage to the p-well 110 of the switch 100 through the buffer circuit 301, as was described above with reference to FIG. 16. Additionally, the output of the power amplifier 140 can be electrically connected to the switch 100.

The buffer circuit 321 can increase the impedance between the p-well bias control block 121 and the p-well 110. When the power amplifier 140 is enabled, the voltage provided by the power amplifier 140 to the source 102 of the switch 100 can vary. For example, when the power amplifier 140 is enabled, a transient signal 327 can be generated by the power amplifier 140 and can reach the switch 102. The transient signal 327 can affect the bias of the source 105. Furthermore, the transient signal 327 can travel through the resistor 113, and can result in a voltage drop at the drain 104. Thus, there is a danger that the transient signal 327 may forward bias diodes 105, 107.

In one embodiment, the p-well bias control block 121 is configured to include a disable function for preventing an unintended forward bias of diodes 105, 107, such as can happen during startup or operation. The disable function can be used to fix the voltage of the p-well 110 at a relatively low voltage. This can prevent the forward biasing of the diodes 105, 107 during start-up, even in the event of an n-diffusion transient swing at turn-on of the quiescent current of the power amplifier 140.

Figure 19A:
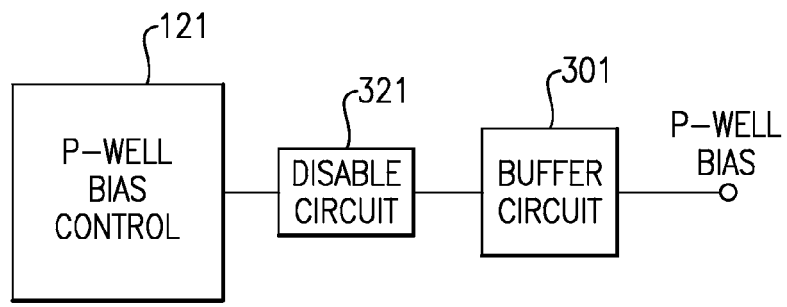
FIG. 19A is a schematic block diagram of a p-well bias control block having a disable circuit in accordance with one embodiment.

FIG. 19A is a schematic block diagram of a p-well bias control block having a disable circuit in accordance with one embodiment. As shown in FIG. 19A, the p-well bias control block 121 can provide an output to a disable circuit 321. The disable circuit 321 can provide the output to the buffer circuit 301, or to vary the output to a value associated with a disabled state. The buffer circuit 301 can receive the output from the disable circuit 321, and can generate the p-well bias control voltage, as was described above.

Figure 19B:
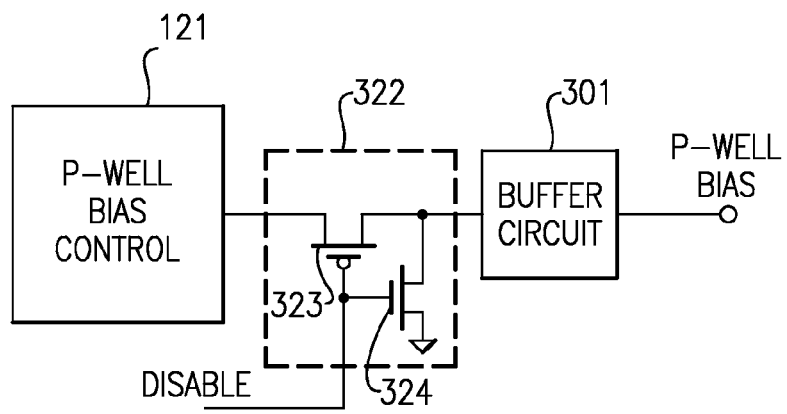
FIG. 19B is a schematic block diagram of a p-well bias control block having a disable circuit in accordance with another embodiment.

FIG. 19B is a schematic block diagram of a p-well bias control block having a disable circuit in accordance with another embodiment. The p-well bias control block 121 can provide an output to a disable circuit 321, which in turn can provide an output to the buffer circuit 321. The disable circuit 321 can include a PMOS transistor 323 and an NMOS transistor 323, each having a gate, a drain, and a source. The source of the PMOS transistor 323 can be electrically connected to the output of the p-well bias control block 121, and drain of the PMOS transistor 323 can be electrically connected to the drain of the NMOS transistor 324. The source of the NMOS transistor 324 can be electrically connected to a ground voltage, and the gate of the NMOS transistor 324 can be electrically connected to the gate of the PMOS transistor 323. The gates of the PMOS and NMOS transistors 323, 324 can be controlled by a disable signal.

Before powering one or more power amplifiers, the disable circuit 322 can be placed in a disabled state in which the p-well bias control voltage can be biased at a relatively low voltage level, such as a ground voltage. Thereafter, the power amplifiers can be enabled and can generate a transient signal 327. However, by holding the p-well bias control voltage in a disabled state, parasitic diodes structures of the switches are prevented from being forward-biased. After initialization of the power amplifiers, the disable circuit 322 can be deactivated, and the p-well bias control block 121 can control the buffer circuit 301 to generate the p-well bias voltage desired for the selected state of the switch.

Figure 19C:
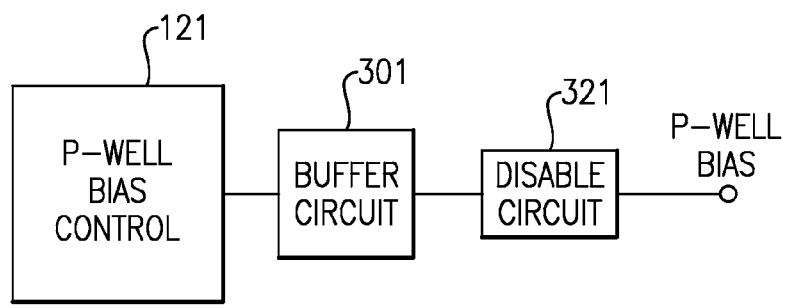
FIG. 19C is a schematic block diagram of a p-well bias control block having a disable circuit in accordance with yet another embodiment.

FIG. 19C is a schematic block diagram of a p-well bias control block having a disable circuit in accordance with yet another embodiment. The p-well bias control block 121 can provide an output to a buffer circuit 301, which in turn can provide an input to a disable circuit 321. In contrast to the disable circuit of FIGS. 19A-19B, the disable circuit 321 of FIG. 19C is positioned before the buffer circuit 321. The positioning of the disable circuit 321 relative to the buffer circuit 301 can be selected based on a number of factors, including the design of the buffer circuit 301 and the disable circuit 321.

Figure 19D:
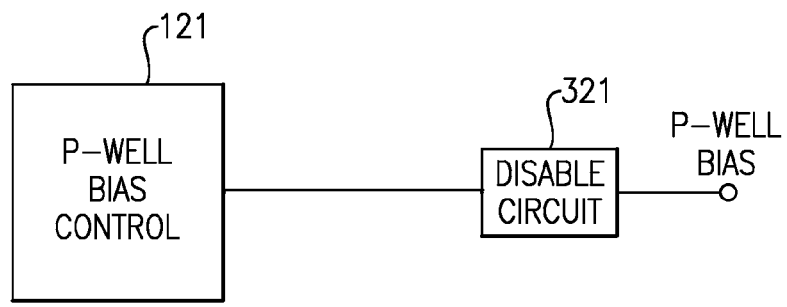
FIG. 19D is a schematic block diagram of a p-well bias control block having a disable circuit in accordance with still yet another embodiment.

FIG. 19D is a schematic block diagram of a p-well bias control block having a disable circuit in accordance with still yet another embodiment. The p-well bias control block 121 can provide an output to a disable circuit 321. In contrast to the disable circuit of FIGS. 19A-19C, the disable circuit 321 of FIG. 19D need not include buffer circuit 321. In certain embodiments of the p-well bias control block 121, such as in embodiments in which the output resistance of the p-well bias control block 121 is relatively high, a disable circuit 321 can be included.

Figure 20:
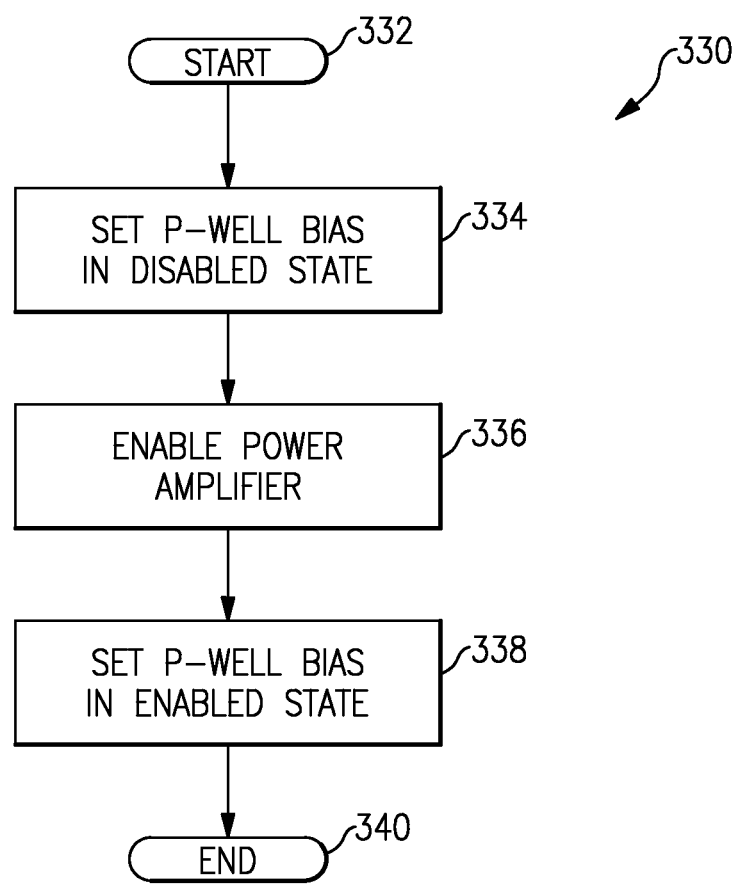
FIG. 20 is a method for biasing a power amplifier system in accordance with another embodiment.

FIG. 20 is a method 330 for biasing a power amplifier system in accordance with another embodiment. The method 330 is depicted from the point of view of a bias control system for a power amplifier system. It will be understood that the methods discussed herein may include greater or fewer operations and the operations may be performed in any order, as necessary. The illustrated method can be used to bias, for example, the power amplifier systems illustrated in FIGS. 3A-3B and FIG. 18.

The method 330 for biasing a power amplifier system starts at 332. In an ensuing block 334, a p-well bias is set in a disabled state. A p-well bias controller can be configured to provide a p-well bias voltage to a switch receiving a signal from a power amplifier. The power amplifier can provide a signal to an associated switch. During start-up of the power amplifier, the power amplifier can produce a transient signal which can be received by a switch. The transient signal can result in the forward biasing of parasitic diode structures associated with the switch. By disabling the p-well bias in block 334, protection against forward biasing of parasitic diode structures in the switch is provided. Disabling of the p-well bias control block can be performed using a disable circuit, as described above.

The method 330 continues at a block 336, in which one or more power amplifiers are enabled. Enabling power amplifiers in block 336 can generate transient signals which can be received by switches. However, as described above in block 334, the p-well bias can be in a disabled state associated with a relatively low voltage. Thus, even if the power amplifiers produce transient electrical signals or quiescent currents once enabled in block 336, forward biasing of parasitic diode structures in the switches can be avoided.

In an ensuing block 338, the p-well bias can be set in an enabled state. This can result in a p-well bias control block biasing the p-well of one or more switches in the proper state. This can include biasing one or more p-wells associated with one or more switches to a voltage associated with an ON switch, such as a relatively high voltage, such as a battery supply voltage. Additionally, this can include biasing one or more p-wells associated with one or more switches to a voltage associated with an OFF switch, such as a relatively low voltage, such as a voltage several volts below a battery supply voltage. The method ends at 340.

Applications

Some of the embodiments described above have provided examples in connection with mobile phones. However, the principles and advantages of the embodiments can be used for any other systems or apparatus that have needs for power amplifier systems.

Such power amplifier systems can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. An apparatus for sensing a bias voltage of a switch, the apparatus comprising:
   a complimentary metal oxide semiconductor (CMOS) switch having a gate, a drain, a source, and a well, the source and drain formed in the well, the gate formed adjacent the well between the source and drain, and the source configured to receive a bias voltage from a power amplifier;
   a switch sense block configured to measure a signal indicative of the voltage of at least one of the source or drain of the switch and to generate an output signal based on the measurement; and
   a well bias control block for biasing the well of the switch, the well bias control block configured to bias the well to at least two voltage levels.

2. The apparatus of claim 1 wherein the well has a p-type doping and the switch includes an n-well for electrically isolating the well from a substrate.

3. The apparatus of claim 1 wherein the switch sense block is configured to measure a signal indicative of the source voltage of the switch.

4. The apparatus of claim 1 wherein the switch sense block is configured to measure a signal indicative of the drain voltage of the switch.

5. The apparatus of claim 1 wherein the switch sense block comprises a filter for filtering the measured signal to produce a filtered signal and a voltage detector for generating the output signal based at least partly upon the voltage level of the filtered signal.

6. The apparatus of claim 5 wherein the filter is a low pass filter.

7. The apparatus of claim 6 wherein the filter is a RC filter.

8. The apparatus of claim 6 wherein the voltage detector is an inverter.

9. The apparatus of claim 1 wherein the switch and the power amplifier are disposed on separate dies.

10. The apparatus of claim 1 wherein the well bias control block is configured to select the voltage level for biasing the well based at least partly on the output signal of the switch sense block.

11. The apparatus of claim 1 wherein the well bias control block comprises at least one charge pump.

12. The apparatus of claim 1 further comprising a resistor having a first end electrically connected to the source of the switch and a second end electrically connected to the drain of the switch.

13. A method for sensing a bias voltage of a CMOS switch configured to receive a radio frequency signal from a power amplifier, the method comprising:
   measuring a signal indicative of at least one of a source voltage or a drain voltage of the switch;
   generating an output signal based on the measurement; and
   biasing a well of the switch using a well bias control block, the well bias control block configured to bias the well to at least two voltage levels.

14. The method of claim 13 further comprising biasing the well of the switch to a voltage level corresponding to a disabled state of the well.

15. The method of claim 13 wherein measuring the signal comprises measuring the source voltage of the switch.

16. The method of claim 13 wherein measuring the signal comprises measuring the drain voltage of the switch.

17. The method of claim 13 further comprising filtering the measured signal to generate a filtered signal.

18. The method of claim 14 further comprising biasing the well of the switch to a voltage level corresponding to an enabled state of the well based at least partly on the output signal.

19. The method of claim 18 wherein biasing the well to an enabled state comprises biasing the voltage level of the well using a charge pump.

20. The method of claim 19 further comprising providing the charge pump a first power supply and providing the power amplifier a second power supply, wherein the first power supply and second power supply are different power supplies.

21. The method of claim 17 wherein generating the output signal comprises comparing the filtered signal to a reference signal.

22. The method of claim 21 wherein generating the output signal comprises comparing the filtered signal to a trip point of an inverter.

23. An apparatus for sensing a bias voltage, the apparatus comprising:

a complimentary metal oxide semiconductor (CMOS) switch having a gate, a drain, a source, and a well, the source and drain formed in the well, the gate formed adjacent the well between the source and drain, and the source configured to receive a bias voltage from a power amplifier;

means for measuring a signal indicative of the voltage of at least one of the source or drain of the switch;

means for generating an output signal based on the measurement; and means for biasing the well of the switch, the well biasing means configured to bias the well to at least two voltage levels.

24. A computer-readable storage medium comprising instructions that when executed by a processor perform a method for sensing a bias voltage of a CMOS switch having a gate, a drain, a source, and a well, the source and drain formed in the well, the gate formed adjacent the well between the source and drain, and the source configured to receive a bias voltage from a power amplifier, the method comprising:

instructing a well bias control block to bias the well of the switch, the well bias control block configured to bias the well to at least two voltage levels;

receiving a signal indicative of the voltage of at least one of the source or drain of the switch; and generating an output signal based on the received signal.

* * * * *